(12) United States Patent
Hopkins et al.

(10) Patent No.: US 10,096,610 B1
(45) Date of Patent: Oct. 9, 2018

(54) POLYSILICON DOPING CONTROLLED 3D NAND ETCHING

(71) Applicant: Intel Corporation, Santa Clara, CA (US)

(72) Inventors: John Hopkins, Boise, ID (US); Younghee Kim, Boise, ID (US); Jie Li, Boise, ID (US); Yu Yuwen, Boise, ID (US); Ramey Abdelrahaman, Boise, ID (US); Kunal Shrotri, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/721,544

(22) Filed: Sep. 29, 2017

(51) Int. Cl.
*H01L 27/11551* (2017.01)
*H01L 27/11524* (2017.01)
*H01L 29/10* (2006.01)
*H01L 29/788* (2006.01)

(52) U.S. Cl.
CPC .. *H01L 27/11524* (2013.01); *H01L 27/11551* (2013.01); *H01L 29/1033* (2013.01); *H01L 29/7889* (2013.01)

(58) Field of Classification Search
CPC .......................... H01L 21/40; H01L 29/66007
See application file for complete search history.

(56) References Cited

U.S. PATENT DOCUMENTS

2014/0367762 A1* 12/2014 Tian ............... H01L 29/66825
257/321

OTHER PUBLICATIONS

O'Neil, P., et al.: "The Log-Structured Merge-Tree (LSM-Tree)", Acta Informatica, Jun. 1996, pp. 351-385, vol. 33, Issue 4, Springer Berlin Heidelberg, Germany.
U.S. Appl. No. 15/391,758, filed Dec. 27, 2016.

* cited by examiner

*Primary Examiner* — Cheung Lee
(74) *Attorney, Agent, or Firm* — Grossman, Tucker, Perreault & Pfleger, PLLC

(57) ABSTRACT

A 3D NAND storage device includes a plurality of layers containing doped semiconductor material interleaved with a plurality of layers of dielectric material. A first portion of the plurality of doped semiconductor material layers may be doped with a first dopant having a first dopant parameter. A second portion of the plurality of doped semiconductor material layers may be doped with a second dopant having a second dopant parameter. In embodiments, the first portion of the plurality of doped semiconductor layers may include a dopant at a concentration less than a defined threshold. In embodiments, the second portion of the plurality of doped semiconductor layers may include a dopant at a concentration less than the defined threshold. The differing dopant concentrations have been found to beneficially and advantageously affect the etch rate in the respective semiconductor layers when forming control gate recesses in the semiconductor layers.

25 Claims, 11 Drawing Sheets

POLYSILICON DOPING CONTROLLED 3D NAND ETCHING

TECHNICAL FIELD

The present disclosure relates to the fabrication of three-dimensional NOT-AND (3D NAND) memory structures.

BACKGROUND

Nonvolatile memory devices, such as Flash storage devices, retain data even after power is removed. This desirable property has led to Flash storage devices being used in memory cards and electronic devices for the storage of data (e.g., contacts in a smartphone) and media files (e.g., audio, video, and image data in a smartphone). The ubiquitousness of such small form factor portable electronic devices, the increasing prevalence and size of media files, and the increasing demand to store such media locally on the portable electronic device in order to have instant access when compared to remote storage solutions has created the "perfect storm" for storage device manufacturers—increase capacity, reduce cost, improve reliability, and reduce storage device footprint to accommodate ever-shrinking device portable electronic device housings.

Three-dimensional NAND (3D NAND) offers a potential solution to the ever increasing demand for storage in electronic devices. Two-dimensional NAND memory is arranged horizontally. Using such an arrangement, physics dictated the minimum spacing between memory cells before electron tunneling and other phenomena affecting the reliability of the storage device occurred. The 3D NAND architecture includes a vertical stack of memory cells, each of which includes: a charge storage structure (floating gate, charge trap, etc.). The stack of memory cells is formed using alternating layers of control gate material and dielectric material. A charge blocking material is disposed between the control gate layer and the charge storage structure associated with the respective cell. The number of control gate layers determine the number of individual storage cells in each vertical 3D NAND structure. Deep stacked 3D NAND structures having 32, 48, or even 72+ control gate layers are possible.

BRIEF DESCRIPTION OF THE DRAWINGS

Features and advantages of various embodiments of the claimed subject matter will become apparent as the following Detailed Description proceeds, and upon reference to the Drawings, wherein like numerals designate like parts, and in which:

Figure 1:
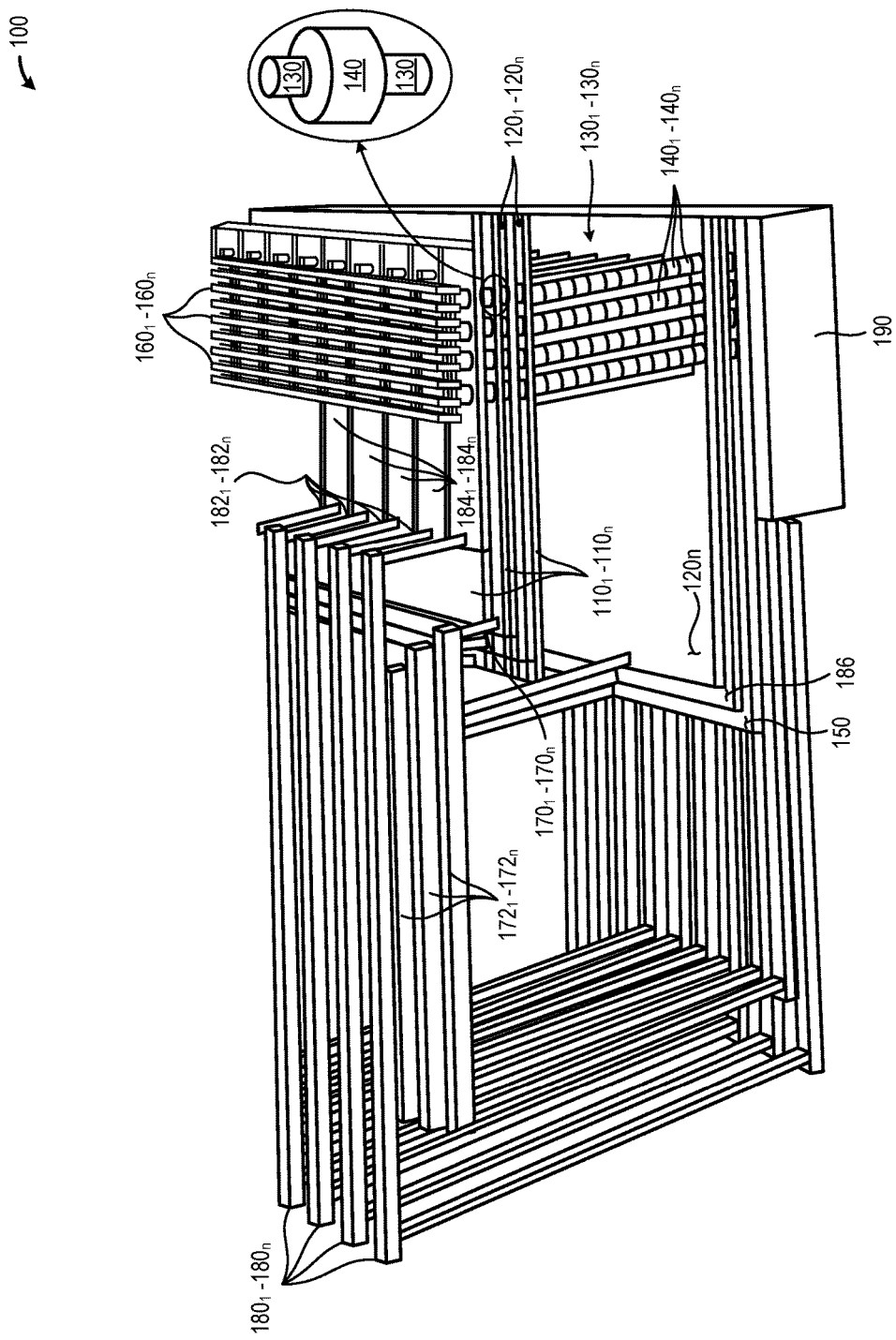
FIG. 1 is a perspective view of an illustrative three-dimensional NAND (3D NAND) memory array that includes a plurality of doped polysilicon word line layers having different dopant concentrations, that are alternatingly stacked with a plurality of dielectric layers in accordance with at least one embodiment described herein.

Although the following Detailed Description will proceed with reference being made to illustrative embodiments, many alternatives, modifications and variations thereof will be apparent to those skilled in the art.

DETAILED DESCRIPTION

A 3D NAND storage device can be formed by stacking alternating layers of doped silicon word line layers and dielectric material (which eventually electrically isolate each of the memory cells along the vertical cell core). After layer deposition is complete, cell holes are formed in the stacked structure. The cell holes may be formed via drilling or via etching with an etch mask. After forming the cell holes, the control gate layers are etched to form a control gate recess (CGR) or "pocket" on each control gate layer. After etching the CGR, a top-oxide inter-poly dielectric (IPD) layer is deposited in the cell hole and the CGRs. A floating gate is then deposited in each CGR along the stack. After depositing the floating gate, a tunnel-oxide is formed and a polysilicon channel deposited to line the cell hole in the stack.

Cross word line cell variability is detrimental to high aspect ratio 3D NAND memory cell integration and memory cell electrical metrics. Thinner cell oxides and smaller pockets in lower word lines result in variable program and erase voltages and, consequently, loss of memory cell reliability. CGR or pocket shaping is correlated to the etching profile within the cell hole. Both CGR shaping and core etch profile influence ultimate memory cell performance, including memory cell formation and film variability. The variability determines the program and erase windows and defines the overall window for cell reliability.

The systems and methods disclosed herein provide greater consistency in forming control gate recesses by adjusting the doping of the word line layers as they are deposited during the fabrication process. More specifically, it has been found that engineered tier polysilicon doping during the in-situ deposition stage of the fabrication process may be used to improve the consistency of CGR shaping during the CGR etch process. The dopant concentration may be adjusted to compensate for cell variability through the optimization of CGR critical dimension (CD) and/or top-oxide and/or trap base thickness. The systems and methods described herein decouple the CGR CD from the incoming etch CD and provide greater uniformity of the CGR cell. Such an improvement beneficially and advantageously flattens the program and erase voltage.

A semiconductor device is provided. The device may include a stacked semiconductor structure having an upper surface and a transversely opposed lower surface, the stacked semiconductor structure including: a plurality of layers formed using a dielectric material; and a plurality of layers formed using a semiconductor material. Each of the plurality of layers of semiconductor material may be interleaved between layers of dielectric material. Each of at least some of the plurality of layers of semiconductor material may include a first dopant having one or more first dopant parameters. Each of at least some of the plurality of layers of semiconductor material include a second dopant having one or more second dopant parameters, the one or more second dopant parameters different than the one or more first dopant parameters; a plurality of channels, each of the channels penetrating the stacked semiconductor structure from the upper surface to the lower surface; and a recess formed in each of layers of semiconductor material in each of the plurality of channels.

A 3D NAND fabrication method is provided. The method may include: interleaving each of a plurality of layers formed using a semiconductor material with a plurality of layers formed using a dielectric material to provide a stacked semiconductor structure having an upper surface and a lower surface; where a first portion of the plurality of layers of semiconductor material include a first dopant having one or more first dopant parameters; and where a second portion of the plurality of layers of semiconductor material include a second dopant having one or more second dopant parameters, the one or more second dopant parameters different than the one or more first dopant parameters; forming a plurality of channels through the stacked semiconductor structure, each of the plurality of channels extending from the upper surface to the lower surface of the stacked semiconductor structure; and removing a portion of at least some of the plurality of layers of semiconductor material forming a periphery of at least a portion of the plurality of channels to provide a recess about the periphery of each of the plurality of channels at each of the plurality of layers of semiconductor material.

A stacked semiconductor fabrication system is provided. The system may include: a means for interleaving each of a plurality of layers formed using a semiconductor material with a plurality of layers formed using a dielectric material to provide a stacked semiconductor structure having an upper surface and a lower surface; where at least some of the plurality of layers of semiconductor material include a first dopant having one or more first dopant parameters; and where at least some of the plurality of layers of semiconductor material include a second dopant having one or more second dopant parameters, the one or more second dopant parameters different than the one or more first dopant parameters; a means for forming a plurality of channels through the stacked semiconductor structure, each of the plurality of channels extending from the upper surface to the lower surface of the stacked semiconductor structure; and means for removing a portion of at least some of the plurality of layers of semiconductor material forming a periphery of at least a portion of the plurality of channels to provide a recess about the periphery of each of the plurality of channels at each of the plurality of layers of semiconductor material.

As used herein the terms "top," "bottom," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

As used herein, the term "logically associated" when used in reference to a number of objects, systems, or elements, is intended to convey the existence of a relationship between the objects, systems, or elements such that access to one object, system, or element exposes the remaining objects, systems, or elements having a "logical association" with or to the accessed object, system, or element. An example "logical association" exists between relational databases where access to an element in a first database may provide information and/or data from one or more elements in a number of additional databases, each having an identified relationship to the accessed element. In another example, if "A" is logically associated with "B," accessing "A" will expose or otherwise draw information and/or data from "B," and vice-versa.

FIG. 1 is a perspective view of an illustrative three-dimensional NAND (3D NAND) memory array 100 that includes a plurality of doped polysilicon word line layers $110_1$-$110_n$, (collectively, "word lines 110") having different dopant concentrations, that are alternatingly stacked with a plurality of dielectric layers $120_1$-$120_{n+1}$ (collectively, "dielectric layers 120"), in accordance with at least one embodiment described herein. A plurality of channels $130_1$-$130_n$ (collectively, "channels 130") penetrate the alternatingly stacked word lines 110 and dielectric layers 120. Memory cells $140_1$-$140_n$ (collectively, "memory cells 140") are formed at the intersection of each of the channels 130 and each of the word lines 110. Each of the channels 130 couples to a source layer 150 disposed at the base of the 3D NAND structure. Bit lines $160_1$-$160_n$ (collectively, "bit lines 160") communicably couple to each of the channels 130. Each of the plurality of word line vias $170_1$-$170_n$ (collectively, "word line vias 170") communicably couple a respective one of a plurality of access lines $172_1$-$172_n$ (collectively "access lines 172") to a respective one of the plurality of word lines 110. Each of a plurality of select line vias $182_1$-$182_n$ (collectively, "select line vias 182") communicably couples a respective one of a plurality of select lines $180_1$-$180_n$ (collectively, "select lines 180") to a respective one of a plurality of drain select gates $184_1$-$184_n$ (collectively, "drain select gates 184").

The 3D NAND memory array 100 includes a plurality word lines 110 and a plurality of dielectric layers 120 stacked such that a dielectric layer 120 separates each of the word lines 110. A memory cell 140 is created at the intersection of each word line 110 and channel 130. Each of the memory cells 140 includes a control gate recess (CGR). The control gate recess (CGR) is formed at the intersection of the word line 110 and the channel 130 by selectively etching a portion of the word line 110, the unetched dielectric layers above and below each of the word lines 110 create the CGR, which may sometimes be referred to as a "pocket." Variations in etch rate along the length of the channel 130 may result in variations in CGR depth (i.e., the CGR critical dimension, or "CGR CD") at one or more memory cell locations along the channel 130. Such variations in CGR CD may cause unacceptably high variations in the program and erase voltages of the memory cell 140 associated with the respective CGR. Thus, ensuring greater consistency in CGR CD at memory cells 140 along each channel 130 ensures greater consistency and/or uniformity of program and erase voltages (and thus, greater reliability) across the 3D NAND memory array 100.

In embodiments, the plurality of word line layers 110 and the plurality of dielectric layers 120 are formed using any currently available or future developed in-situ material deposition process and/or method. In embodiments, the alternating stack of word line layers 110 and dielectric layers 120 may be deposited on a substrate, such as a doped polysilicon substrate that provides the source layer 150 for the 3D NAND memory array 100. A plurality of apertures, each extending transversely through the plurality of word line layers 110 and the plurality of dielectric layers 120 but not through the source layer 150, may be formed using any currently available or future developed material removal technique, such as laser ablation, drilling, or chemical etching. One or more chemical etchants may then be introduced to the plurality of apertures to selectively etch each of the word line layers 110 to provide the CGR. The etching process may remove greater quantities of doped polysilicon from the uppermost word line layers 110 than from the lowermost word line layers 110. Such differential removal of doped polysilicon word line layers 110 along the length of the cell 130 causes inconsistencies in the CGR CD along the length of the cell 130, leading to variability in the program and erase voltages required to read and write to the memory cells 140 formed along the channel 130.

Figure 2:
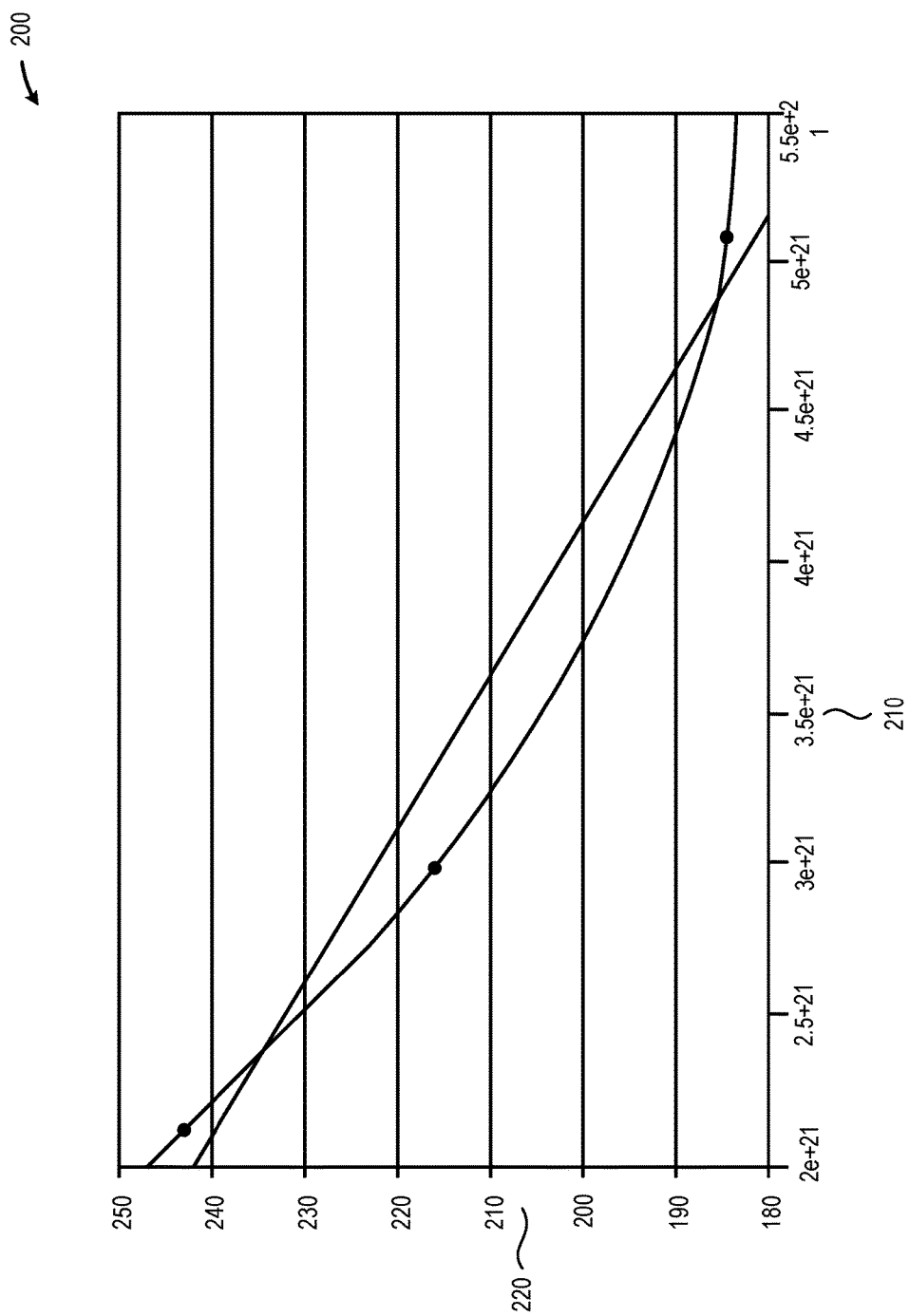
FIG. 2 is a graph of dopant concentration along the x-axis against control gate recess critical dimension (CGR CD, i.e., CGR etch depth) along the y-axis that demonstrates increasing the dopant concentration in the word line layer from $2 \times 10^{21}$ cm$^{-3}$ to $5 \times 10^{21}$ cm$^{-3}$ causes the CGR CD to decrease from about 24.5 nanometers (nm) to about 18.6 nm, a 25% reduction (approx. 6 nm) in CGR CD, in accordance with at least one embodiment described herein.

Each word line layer 110 is formed using a layer of doped polysilicon. Dopants may include p-type dopants or n-type dopants. In embodiments, the word line layer 110 may be doped using one or more n-type dopants. Example n-type dopants include, but are not limited to: phosphorus/phosphorus containing compounds (e.g., phosphine); arsenic/arsenic containing compounds; bismuth/bismuth containing compounds; antimony/antimony containing compounds; and lithium/lithium containing compounds. In embodiments, the word line layer 110 may have a dopant concentration of greater than: about $1 \times 10^{15}$ atoms/cm³ (cm⁻³); about $1 \times 10^{17}$ cm⁻³; about $1 \times 10^{19}$ cm⁻³; about $1 \times 10^{21}$ cm⁻³; $1 \times 10^{23}$ cm⁻³; $1 \times 10^{25}$ cm⁻³; $1 \times 10^{27}$ cm⁻³; or about $1 \times 10^{29}$ cm⁻³. In at least some implementations, the dopant may include a phosphine and/or phosphine containing compounds. It has been found that by adjusting the dopant concentration in at least some of the word line layers 110, the etch rate in the respective word line layer 110 may be adjusted to beneficially and advantageously provide greater consistency in CGR CD along the length of the channel 130. More specifically, it has been found by decreasing the dopant concentration in the word line layer 110, the etch rate during the formation of the CGR 301 in the respective word line layer 110 surprisingly increases. Stated differently, an inverse relationship exists between word line layer dopant concentration and the CGR etch rate in a respective word line layer 110. For example, FIG. 2 is a graph of dopant concentration along the x-axis 210 against CGR CD (i.e., CGR etch depth) along the y-axis 220 that demonstrates increasing the dopant concentration in the word line layer 110 from $2 \times 10^{21}$ cm⁻³ to $5 \times 10^{21}$ cm⁻³ causes the CGR CD to decrease from about 24.5 nanometers (nm) to about 18.6 nm, a 25% reduction (approx. 6 nm) in CGR CD attributable solely to reducing the dopant concentration in the word line layer 110.

Figure 3:
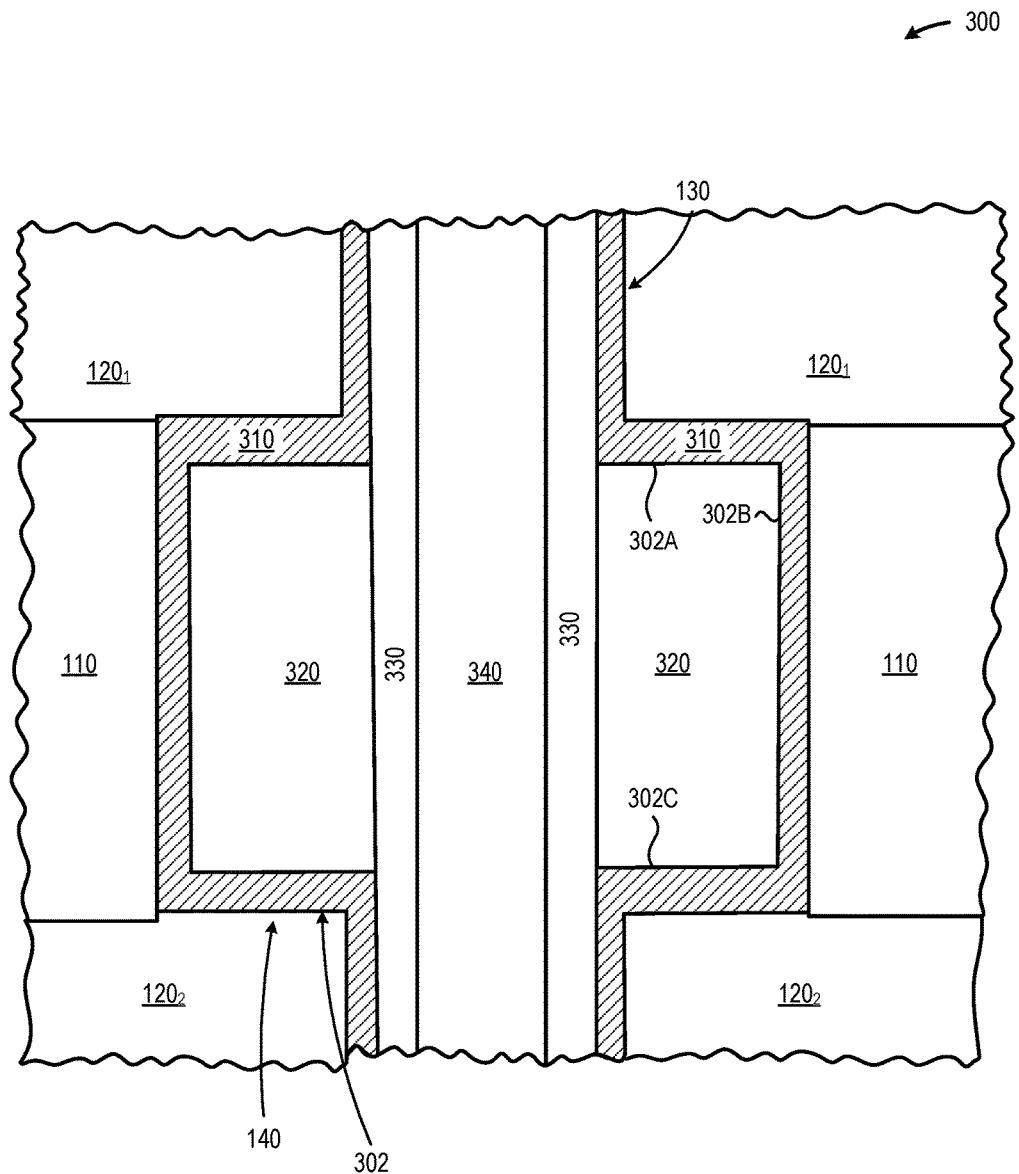
FIG. 3 is a cross-sectional elevation of an illustrative memory cell such as depicted in the 3D NAND memory array depicted in FIG. 1, in accordance with at least one embodiment described herein.

FIG. 3 is a cross-sectional elevation of an illustrative memory cell 140 such as depicted in the 3D NAND memory array 110 depicted in FIG. 1, in accordance with at least one embodiment described herein. As depicted in FIG. 3, the CGR 302 is formed on three sides by the lower surface of the dielectric layer 302A above the word line layer 110, the word line layer 302B, and the upper surface of the dielectric layer 320C below the word line layer 110. After the formation of the CGR 302, an inter-poly dielectric (IPD) layer 310 is deposited across the surfaces of the CGR 302 and along the extent of the channel 130. The IPD layer 310 may include, but is not limited to, a dielectric material such as silicon oxide, silicon nitride, silicon oxynitride, an oxide-nitride-oxide (ONO), or any other single or combination of high-k dielectric and/or insulating materials. After deposition of the IPD layer 310, a floating gate 320 is formed in the CGR 302. The floating gate 320 may include, but is not limited to a silicon containing material, such as n-doped polysilicon, p-doped polysilicon, or undoped silicon. After formation of the floating gate 320 a tunnel oxide 330 is deposited along the core 130 and across the surface of the floating gate 320. A core material 340 may be deposited in the channel 130 proximate the tunnel oxide layer 330. In embodiments, the core material 340 may include n-doped polysilicon, p-doped polysilicon, or undoped polysilicon.

Figure 4:
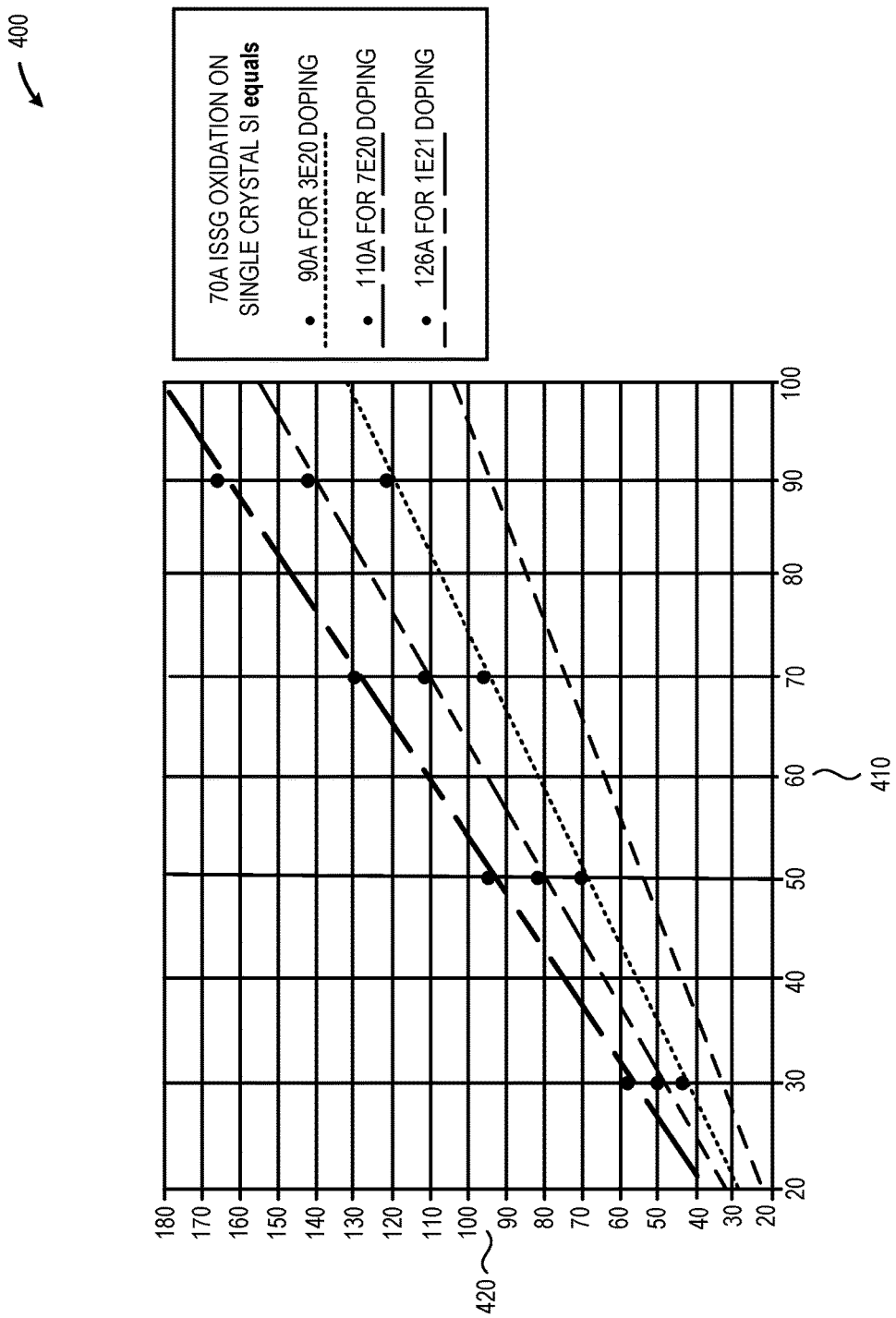
FIG. 4 is a graph of undoped word line layer IPD layer thickness along the x-axis against doped silicon inter-poly dielectric (IPD) layer thickness along the y-axis that demonstrates increasing the dopant concentration in the word line layer from $3 \times 10^{20}$ cm$^{-3}$ to $1 \times 10^{21}$ cm$^{-3}$ causes the IPD layer thickness to increase by a minimum of about 30% over undoped silicon, in accordance with at least one embodiment described herein.

It has also been found that by adjusting the dopant concentration in at least some of the word line layers 110, the thickness of the IPD layer 310 may be beneficially and advantageously increased, particularly in proximity to the CGR 302. More specifically, it has been found that by decreasing the dopant concentration in the polysilicon layer forming the word line layer 110, the thickness of the deposited IPD layer 310 surprisingly increases. Stated differently, a direct relationship has been found to exist between word line layer dopant concentration and the thickness of the resultant IPD layer 310 deposited proximate the CGR 302. For example, FIG. 4 is a graph of undoped word line layer IPD layer thickness along the x-axis 410 against doped silicon IPD layer thickness along the y-axis 420 that demonstrates increasing the dopant concentration in the word line layer 110 from $3 \times 10^{20}$ cm$^{-3}$ to $1 \times 10^{21}$ cm$^{-3}$ causes the IPD layer thickness to increase by a minimum of about 30% over undoped silicon. Such an increase in IPD layer thickness is attributable solely to increasing the dopant concentration in the word line layer 110.

FIGS. 5A-5F depict an illustrative fabrication method for a 3D NAND storage structure in which different word line layers 110 have different dopant concentrations, in accordance with at least one embodiment described herein. In embodiments, a 3D NAND includes a stack containing a plurality of interleaved word line layers 110 and dielectric layers 120. Channels 130 are bored in the stacked layers and control gate recesses 302 are etched in each of the word line layers 110. The systems and methods described herein beneficially and advantageously employ differing dopant concentrations in some or all of the plurality of word line layers 110 to provide desirable CGR critical dimensions (e.g., CGR depth). After etching the CGR 302 in each of the word line layers 110, an inter-poly dielectric 310 layer is deposited across the surfaces of the CGR 302 and the channel 130. The systems and methods described herein beneficially and advantageously employ differing dopant concentrations in some or all of the plurality of word line layers to provide desirable IPD parameters (e.g., IPD thickness).

Figure 5A:
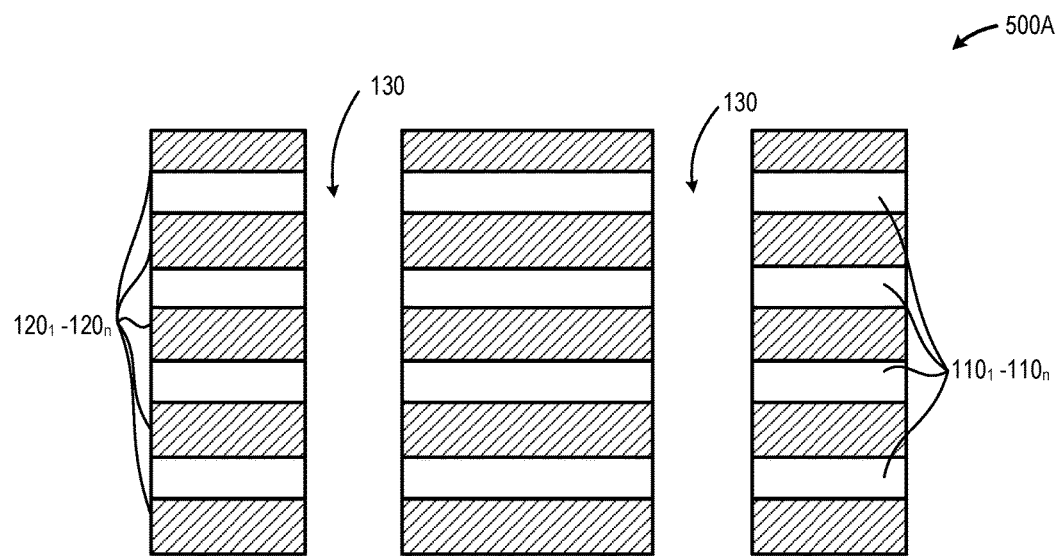
FIG. 5A is a cross-sectional elevation of an illustrative 3D NAND memory stack that includes a plurality of word line layers interleaved with a plurality of dielectric layers, in accordance with at least one embodiment described herein.

FIG. 5A is a cross-sectional elevation of an illustrative 3D NAND memory stack 500 that includes a plurality of word line layers 110 interleaved with a plurality of dielectric layers 120, in accordance with at least one embodiment described herein. The plurality of word line layers 110 and the plurality of dielectric layers 120 are deposited in an interleaved pattern using any currently available or future developed material deposition process or method. Example deposition methods or processes include, but are not limited to: physical vapor deposition (PVD); chemical vapor deposition (CVD); atomic layer deposition (ALD); and spin coating. In embodiments, PVD may include techniques such as: sputtering, evaporation, and ionized PVD. Each of the channels 130 included in the plurality of channels 130 may be formed using any currently available or future developed material removal process or method. For example, each of the channels 130 may be formed using drilling, laser ablation, or wet-etching. In embodiments, the 3D NAND memory stack 500 may be deposited on a substrate that includes, but is not limited to, a silicon semiconductor (e.g., a source layer 150); one or more etch stop layers; and one or more buffer layers disposed between the source layer 150 and the one or more etch stop layers.

In embodiments, the word line layer 110 may be formed of and include at least one conductive material, such as: a metal; a metal alloy; a conductive metal-containing material; a conductively-doped semiconductor material; or combinations thereof. Example metals include, but are not limited to: tungsten, titanium, molybdenum, niobium, vanadium, hafnium, tantalum, chromium, zirconium, iron, ruthenium, osmium, cobalt, rhodium, iridium, nickel, palladium, platinum, copper, silver, gold, and aluminum. Example metal alloys include, but are not limited to: a cobalt-based alloy; an iron-based alloy; a nickel-based alloy; an iron- and cobalt-based alloy; a cobalt- and nickel-based alloy; a cobalt- nickel- and iron-based alloy; an aluminum-based alloy; a copper-based alloy; a magnesium-based alloy; a titanium-based alloy; a steel, a low carbon steel; and a stainless steel. Example conductive metal-containing materials include, but are not limited to: a conductive metal nitride; a conductive metal silicide; a conductive metal carbide; a conductive metal oxide. Example conductively doped semiconductor materials include, but are not limited to: conductively-doped silicon; conductively doped germanium; and conductively doped silicon-germanium. In embodiments, the word line layer 110 may have a thickness of: about 10 nanometers (nm) or less; about 20 nm or less; about 30 nm or less; about 50 nm or less; about 75 nm or less; or about 100 nm or less. In embodiments, each of the plurality of word line layers 110 may have the same parameters (e.g., thickness and/or composition). In embodiments, at least some of the plurality of word line layers 110 may have different parameters. For example, in embodiments, the word line layers 110 proximate the bottom of the channel 130 (i.e., the portion of the channel 130 closest the 3D NAND memory structure source layer 150) may have a different dopant concentration or composition than the word line layers 110 proximate the top of the channel 130.

In embodiments, the dielectric layer 120 may be formed of and include at least one insulating material, such as: an oxide material; a nitride material; amorphous carbon; or an oxynitride material. Example oxides include, but are not limited to: silicon dioxide; phosphosilicate glass; borosilicate glass; borophosphosilicate glass; fluorosilicate glass; titanium dioxide; zirconium dioxide; hafnium dioxide; tantalum oxide; magnesium oxide; aluminum oxide; or combinations thereof. Example nitrides include, but are not limited to: silicon nitride. Example oxynitrides include, but are not limited to: silicon oxynitride. In embodiments, the dielectric layer 120 may have a thickness of: about 10 nanometers (nm) or less; about 20 nm or less; about 30 nm or less; about 50 nm or less; about 75 nm or less; or about 100 nm or less. In embodiments, each of the plurality or dielectric layers 120 may have the same thickness and/or composition.

Figure 5B:
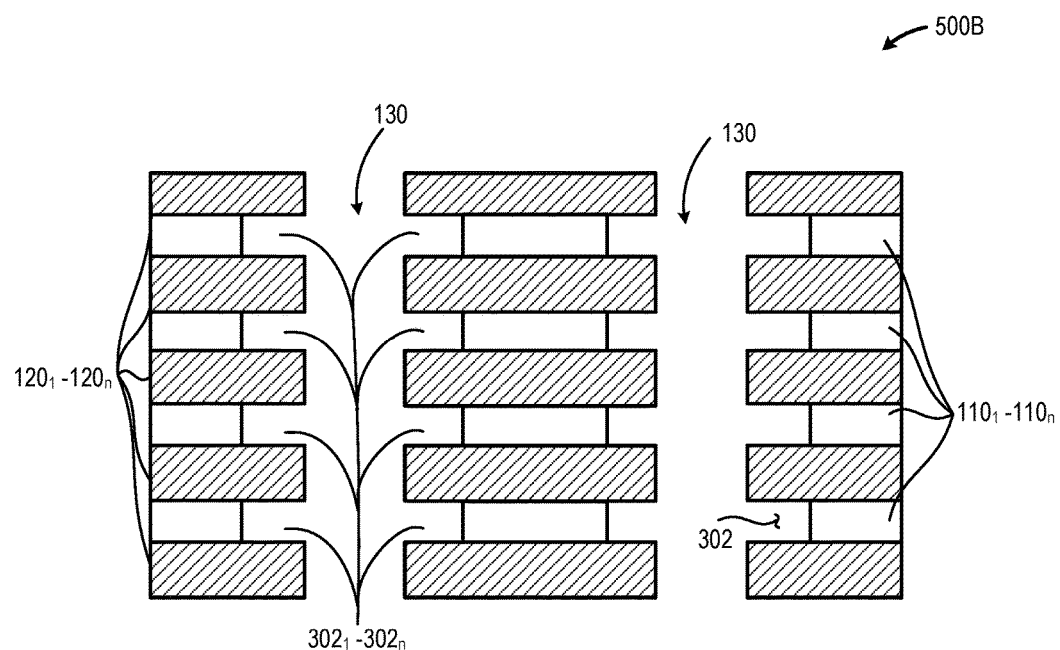
FIG. 5B is a cross-sectional elevation of the illustrative 3D NAND stack from FIG. 5A after a portion of the word line layers have been removed to create control gate recesses (CGRs) 302 along the walls of the channel 130, in accordance with at least one embodiment described herein.

FIG. 5B is a cross-sectional elevation of the illustrative 3D NAND stack 500 from FIG. 5A after a portion of the word line layers 110 have been removed to create control gate recesses (CGRs) 302 along the walls of the channel 130, in accordance with at least one embodiment described herein. In embodiments, the CGRs 302 may be formed using any currently available or future developed material removal process or method. In at least one embodiment, the CGRs 302 may be formed via wet-etching the word line layers 110. In embodiments, the dopant concentration in at least some of the word line layers 110 may be adjusted to provide an desired etch rate for forming the CGR 302 in the respective word line layer 110. For example, a baseline dopant concentration may be increased in some word line layers 110 to decrease the CGR etch rate in each of the respective word line layers 110, or decreased in other word line layers 110 to increase the CGR etch rate of the respective word line layers 110.

Figure 5C:
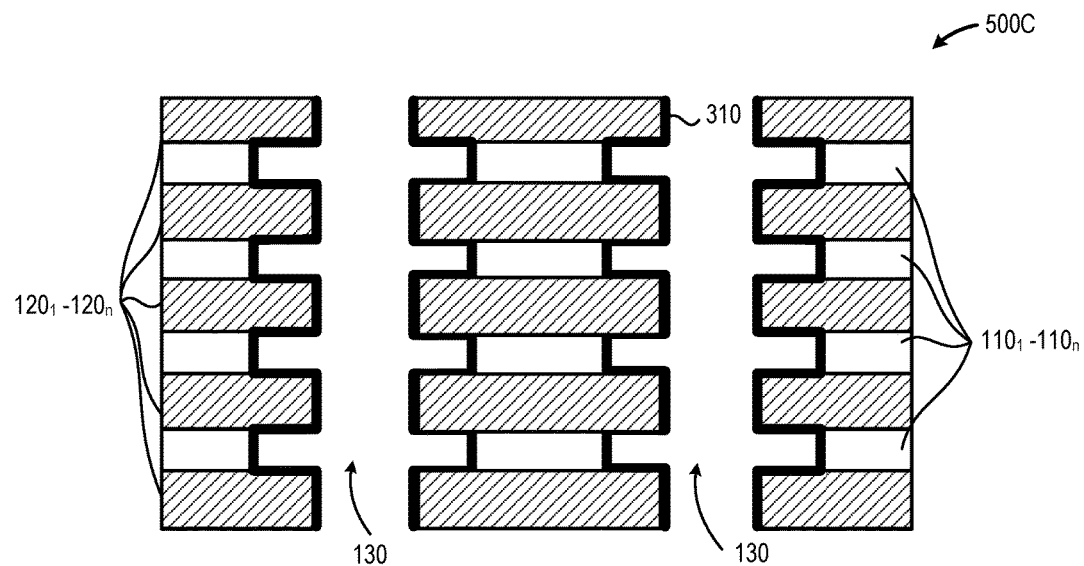
FIG. 5C is a cross-sectional elevation of the illustrative 3D NAND stack from FIG. 5B after deposition of an inter-poly dielectric layer in the control gate recesses (CGRs) and along the walls of the channel, in accordance with at least one embodiment described herein.

FIG. 5C is a cross-sectional elevation of the illustrative 3D NAND stack 500 from FIG. 5B after deposition of an inter-poly dielectric layer 310 in the control gate recesses (CGRs) 302 and along the walls of the channel 130, in accordance with at least one embodiment described herein. In embodiments, the IPD layer 310 may be deposited using any currently available or future developed material deposition process or method. The IPD layer 310 may include, but is not limited to, a dielectric material such as silicon oxide, silicon nitride, silicon oxynitride, or any other single or combination of high-k dielectric and/or insulating materials. In embodiments, the dopant concentration in at least some of the word line layers 110 may be adjusted to provide a desired IPD layer thickness within at least the CGR 302 in the respective word line layer 110. For example, a baseline dopant concentration may be increased in some word line layers 110 to increase the IPD layer 310 thickness in each of the respective word line layers 110, or decreased in other word line layers 110 to decrease the IPD layer 310 thickness in each of the respective word line layers 110.

Figure 5D:
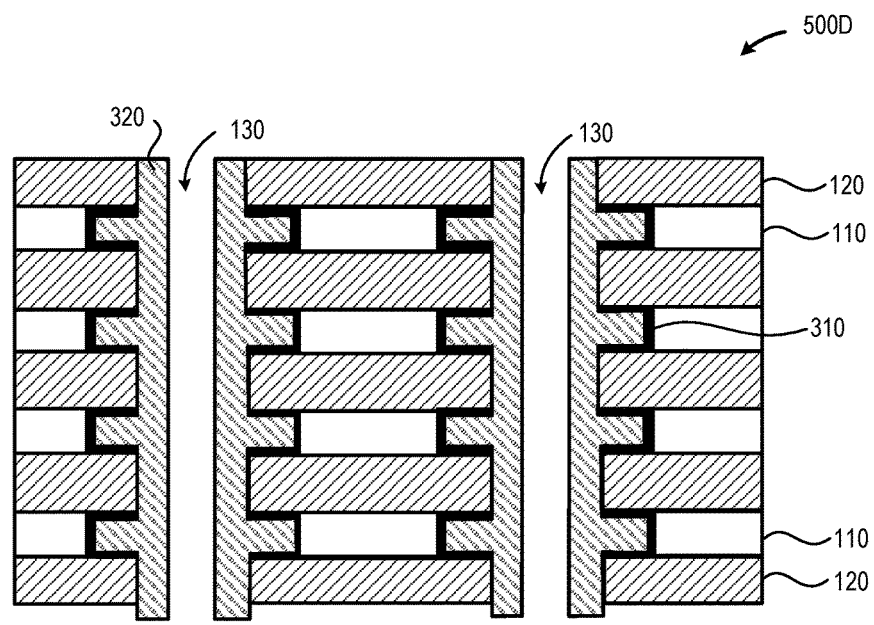
FIG. 5D is a cross-sectional elevation of the illustrative 3D NAND stack from FIG. 5C after deposition of floating gates across the IPD layer, in accordance with at least one embodiment described herein.

FIG. 5D is a cross-sectional elevation of the illustrative 3D NAND stack 500 from FIG. 5C after deposition of floating gates 320 across the IPD layer 310, in accordance with at least one embodiment described herein. In embodiments, the floating gates 320 may be deposited using any currently available or future developed material deposition process or method. The floating gate 320 may include, but is not limited to a silicon containing material, such as n-doped polysilicon, p-doped polysilicon, or undoped silicon.

Figure 5E:
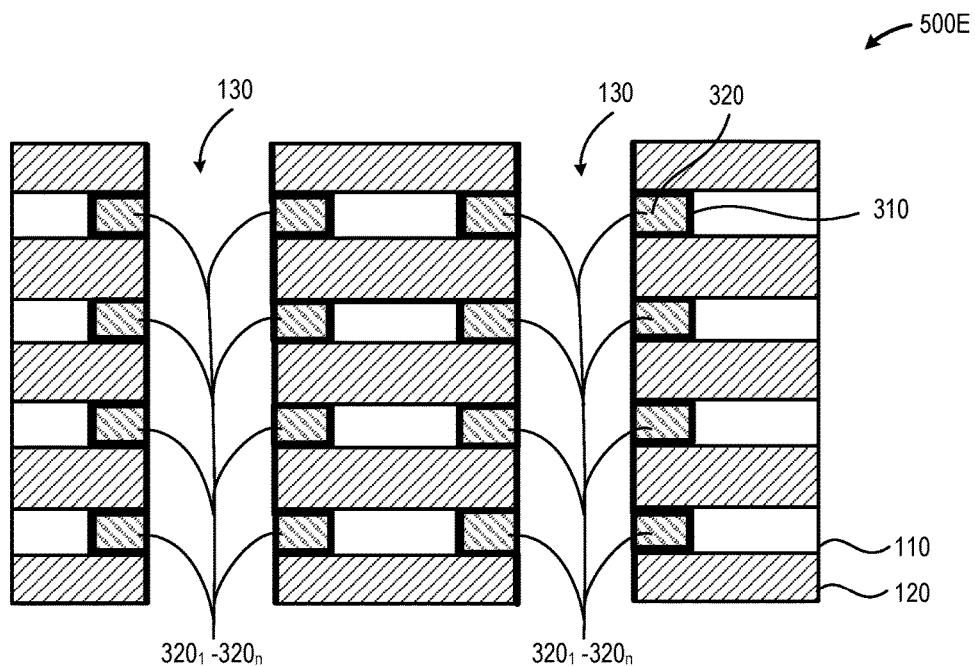
FIG. 5E is a cross-sectional elevation of the illustrative 3D NAND stack from FIG. 5D after all or a portion of the material forming the floating gates has been removed from the channel, in accordance with at least one embodiment described herein.

FIG. 5E is a cross-sectional elevation of the illustrative 3D NAND stack 500 from FIG. 5D after all or a portion of the material forming the floating gates 320 has been removed from the channel 130, in accordance with at least one embodiment described herein. Removal of the floating gate material from the channel 130 isolates each of the floating gates 320 disposed in the CGRs 302 in each word line layer 110. Removal of the floating gate material from the channel 130 may be accomplished using any currently available or future developed material removal process or method. Example material removal processes include, but are not limited to, one or more of the following: mechanical drilling, laser drilling, wet-etching, or laser ablation. Example processes or methods for removal of the floating gate material from the channel 130 include, but are not limited to: a gas chemical etch system (e.g., ammonia vapor); ammonium fluoride ($NH_4F$)+nitric acid ($HNO_3$); oxidation (e.g., $O_3$, $HNO_3$, $H_2O_2$)+hydrofluoric acid (HF) oxide strip; tetramethylammonium hydroxide (TMAH); or similar material removal processes.

Figure 5F:
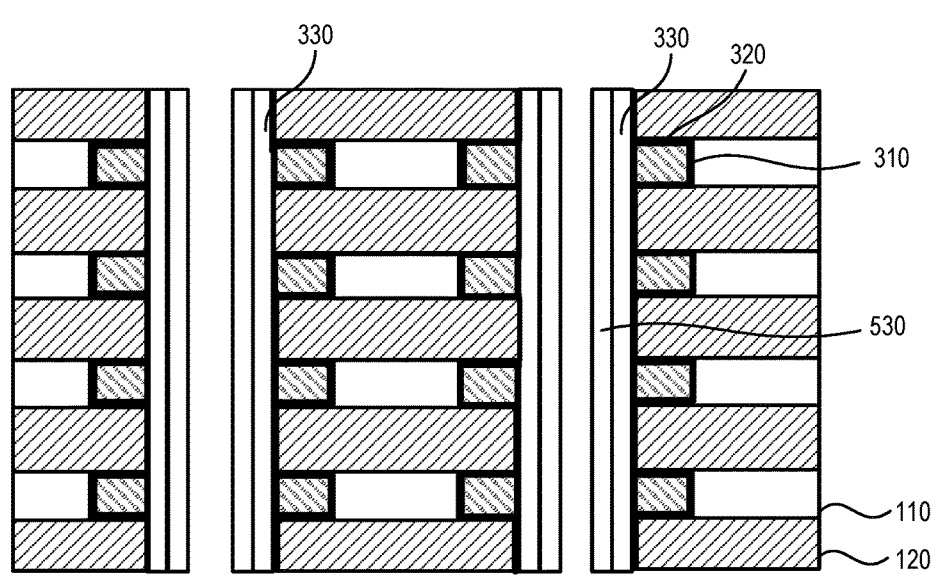
FIG. 5F is a cross-sectional elevation of the illustrative 3D NAND stack from FIG. 5E after deposition of a tunnel oxide layer and the formation of a core in the channel, in accordance with at least one embodiment described herein.

FIG. 5F is a cross-sectional elevation of the illustrative 3D NAND stack 500 from FIG. 5E after deposition of a tunnel oxide layer 330 and the formation of a core 530 in the channel 130, in accordance with at least one embodiment described herein. The tunnel oxide layer 330 may include, but is not limited to, one or more dielectric materials permitting Fowler-Nordheim tunneling of electrons or direct tunneling of holes, or by other electron/hole injection mechanisms. In embodiments, the tunnel oxide layer 330 may include a deposited or thermally grown silicon dioxide.

The core 530 may include one or more materials such as poly-silicon or other semiconductor material. The core 530 may be continuous from the substrate on which the 3D NAND memory structure 500 is formed to the topmost dielectric layer 120 forming the 3d NAND memory structure 500. The core 530 may include, but is not limited to: a epitaxially deposited silicon material; an elemental silicon-based material; a polysilicon material; an amorphous semiconductor material; a compound semiconductor material; or combinations thereof. The core 530 may be deposited using any currently available or future developed material deposition process or method.

Figure 6:
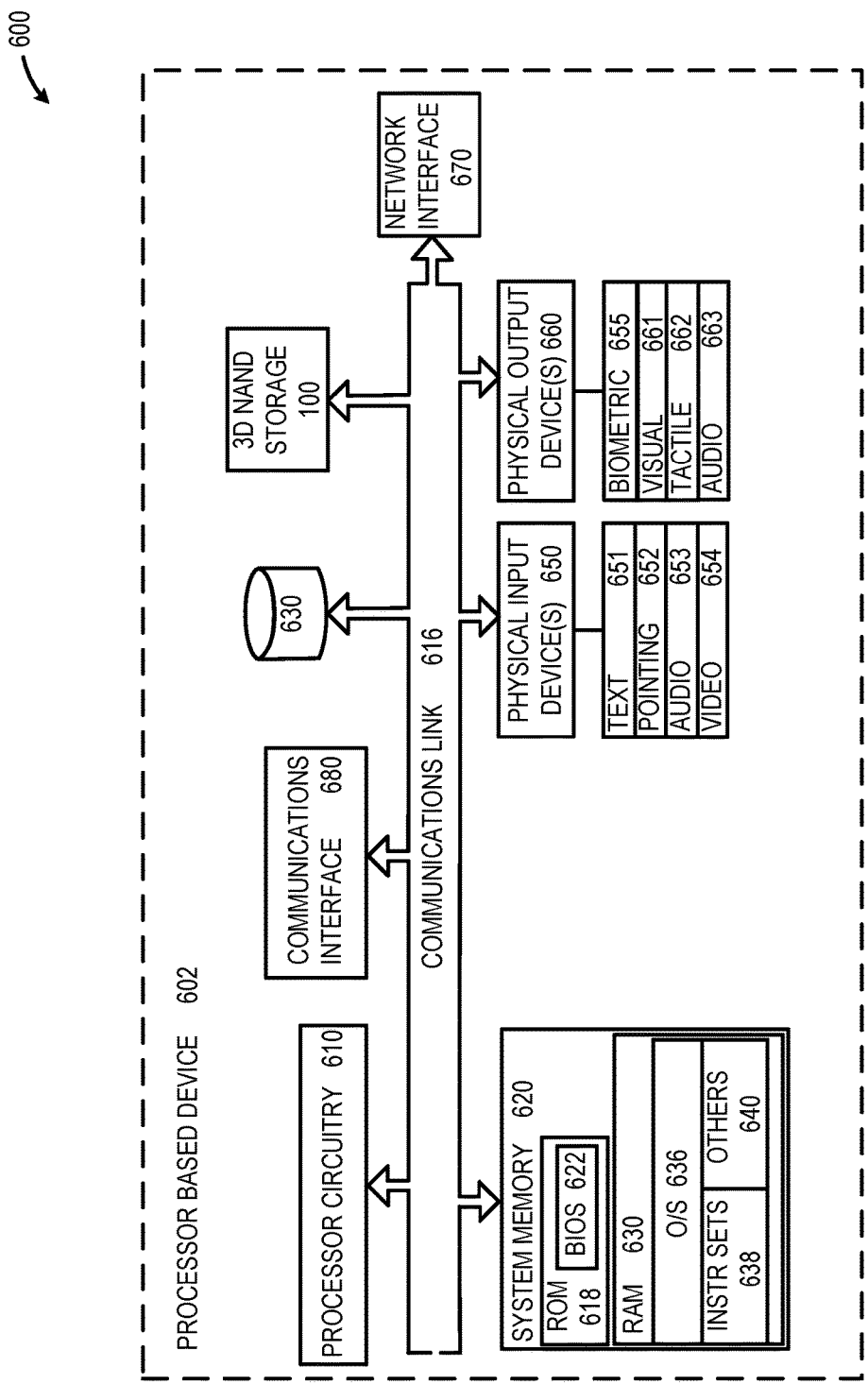
FIG. 6 is a block diagram of a system that includes an illustrative processor-based device equipped with at least one 3D NAND storage device, in accordance with at least one embodiment described herein.

FIG. 6 is a block diagram of a system 600 that includes an illustrative processor-based device 602 equipped with at least one 3D NAND storage device 100, in accordance with at least one embodiment described herein. The following discussion provides a brief, general description of the components forming the illustrative processor-based device 602 such as a smartphone, wearable computing device, portable computing device, or similar device using a 3D NAND-based semiconductor device, such as the 3D NAND-based storage device 100 depicted in FIG. 6.

The processor-based device 602 includes processor circuitry 610 capable of executing machine-readable instruction sets, reading data from the 3D NAND-based storage device 100 and writing data to the 3D NAND-based storage device 100. Those skilled in the relevant art will appreciate that the illustrated embodiments as well as other embodiments can be practiced with other circuit-based device configurations, including portable electronic or handheld electronic devices, for instance smartphones, portable computers, wearable computers, microprocessor-based or programmable consumer electronics, personal computers ("PCs"), network PCs, minicomputers, mainframe computers, and the like.

The processor circuitry 610 may include any number of hardwired or configurable circuits, some or all of which may include programmable and/or configurable combinations of electronic components, semiconductor devices, and/or logic elements that are disposed partially or wholly in a PC, server, or other computing system capable of executing machine-readable instructions. The processor-based device 602 includes the processor circuitry 610 and bus or similar communications link 616 that communicably couples and facilitates the exchange of information and/or data between various system components including a system memory 620, one or more rotating data storage devices 630, and/or one or more 3D NAND-based storage devices 100. The processor-based device 602 may be referred to in the singular herein, but this is not intended to limit the embodiments to a single device and/or system, since in certain embodiments, there will be more than one processor-based device 602 that incorporates, includes, or contains any number of communicably coupled, collocated, or remote networked circuits or devices.

The processor circuitry 610 may include any number, type, or combination of devices. At times, the processor circuitry 610 may be implemented in whole or in part in the form of semiconductor devices such as diodes, transistors, inductors, capacitors, and resistors. Such an implementation may include, but is not limited to any current or future developed single- or multi-core processor or microprocessor, such as: on or more systems on a chip (SOCs); central processing units (CPUs); digital signal processors (DSPs); graphics processing units (GPUs); application-specific integrated circuits (ASICs), field programmable gate arrays (FPGAs), and the like. Unless described otherwise, the construction and operation of the various blocks shown in FIG. 6 are of conventional design. Consequently, such blocks need not be described in further detail herein, as they will be understood by those skilled in the relevant art. The communications link 616 that interconnects at least some of the components of the processor-based device 602 may employ any known serial or parallel bus structures or architectures.

The system memory 620 may include read-only memory ("ROM") 618 and random access memory ("RAM") 630. A portion of the ROM 618 may be used to store or otherwise retain a basic input/output system ("BIOS") 622. The BIOS 622 provides basic functionality to the processor-based device 602, for example by causing the processor circuitry 610 to load one or more machine-readable instruction sets. In embodiments, at least some of the one or more machine-readable instruction sets cause at least a portion of the processor circuitry 610 to provide, create, produce, transition, and/or function as a dedicated, specific, and particular machine.

The processor-based device 602 may include one or more communicably coupled, non-transitory, data storage devices, such as one or more hard disk drives 630 and/or one or more 3D NAND-based storage devices 100, such as described in FIGS. 1 through 5, above. The one or more data storage devices 630 may include any current or future developed storage appliances, networks, and/or devices. Non-limiting examples of such data storage devices 630 may include, but are not limited to, any current or future developed non-transitory storage appliances or devices, such as one or more magnetic storage devices, one or more optical storage devices, one or more solid-state electromagnetic storage devices, one or more electro-resistive storage devices, one or more molecular storage devices, one or more quantum storage devices, or various combinations thereof. In some implementations, the one or more data storage devices 630 may include one or more removable storage devices, such as one or more flash drives, flash memories, flash storage units, or similar appliances or devices capable of communicable coupling to and decoupling from the processor-based device 602.

The one or more data storage devices 630 and/or the one or more 3D NAND-based storage devices 100 may include interfaces or controllers (not shown) communicatively coupling the respective storage device or system to the communications link 616. The one or more data storage devices 630 may store, retain, or otherwise contain machine-readable instruction sets, data structures, program modules, data stores, databases, logical structures, and/or other data useful to the processor circuitry 610 and/or one or more applications executed on or by the processor circuitry 610. In some instances, one or more data storage devices 630 may be communicably coupled to the processor circuitry 610, for example via communications link 616 or via one or more wired communications interfaces (e.g., Universal Serial Bus or USB); one or more wireless communications interfaces (e.g., Bluetooth®, Near Field Communication or NFC); one or more wired network interfaces (e.g., IEEE 802.3 or Ethernet); and/or one or more wireless network interfaces (e.g., IEEE 802.11 or WiFi®).

Machine-readable instruction sets 638 and other modules 640 may be stored in whole or in part in the system memory 620. Such instruction sets 638 may be transferred, in whole or in part, from the one or more data storage devices 630 and/or the one or more 3D NAND-based storage devices 100. The instruction sets 638 may be loaded, stored, or otherwise retained in system memory 620, in whole or in part, during execution by the processor circuitry 610. The machine-readable instruction sets 638 may include machine-readable and/or processor-readable code, instructions, or similar logic capable of providing the speech coaching functions and capabilities described herein.

A system user may provide, enter, or otherwise supply commands (e.g., acknowledgements, selections, confirmations, and similar) as well as information and/or data (e.g., subject identification information, color parameters) to the processor-based device 602 using one or more communicably coupled input devices 650. The one or more communicably coupled input devices 650 may be disposed local to or remote from the processor-based device 602. The input devices 650 may include one or more: text entry devices 651 (e.g., keyboard); pointing devices 652 (e.g., mouse, trackball, touchscreen); audio input devices 653; video input devices 654; and/or biometric input devices 655 (e.g., fingerprint scanner, facial recognition, iris print scanner, voice recognition circuitry). In embodiments, at least some of the one or more input devices 650 may include a wired or a wireless communicable coupling to the processor-based device 602.

The system user may receive output (e.g., feedback from the presenter feedback circuitry 116) from the processor-based device 602 via one or more output devices 660. In at least some implementations, the one or more output devices 660 may include, but are not limited to, one or more: visual output or display devices 661; tactile output devices 662; audio output devices 663, or combinations thereof. In embodiments, at least some of the one or more output devices 660 may include a wired or a wireless communicable coupling to the processor-based device 602.

For convenience, a network interface 670, the processor circuitry 110, the system memory 620, the one or more input devices 650 and the one or more output devices 660 are illustrated as communicatively coupled to each other via the communications link 616, thereby providing connectivity between the above-described components. In alternative embodiments, the above-described components may be communicatively coupled in a different manner than illustrated in FIG. 6. For example, one or more of the above-described components may be directly coupled to other components, or may be coupled to each other, via one or more intermediary components (not shown). In some embodiments, all or a portion of the communications link 616 may be omitted and the components are coupled directly to each other using suitable wired or wireless connections.

Figure 7:
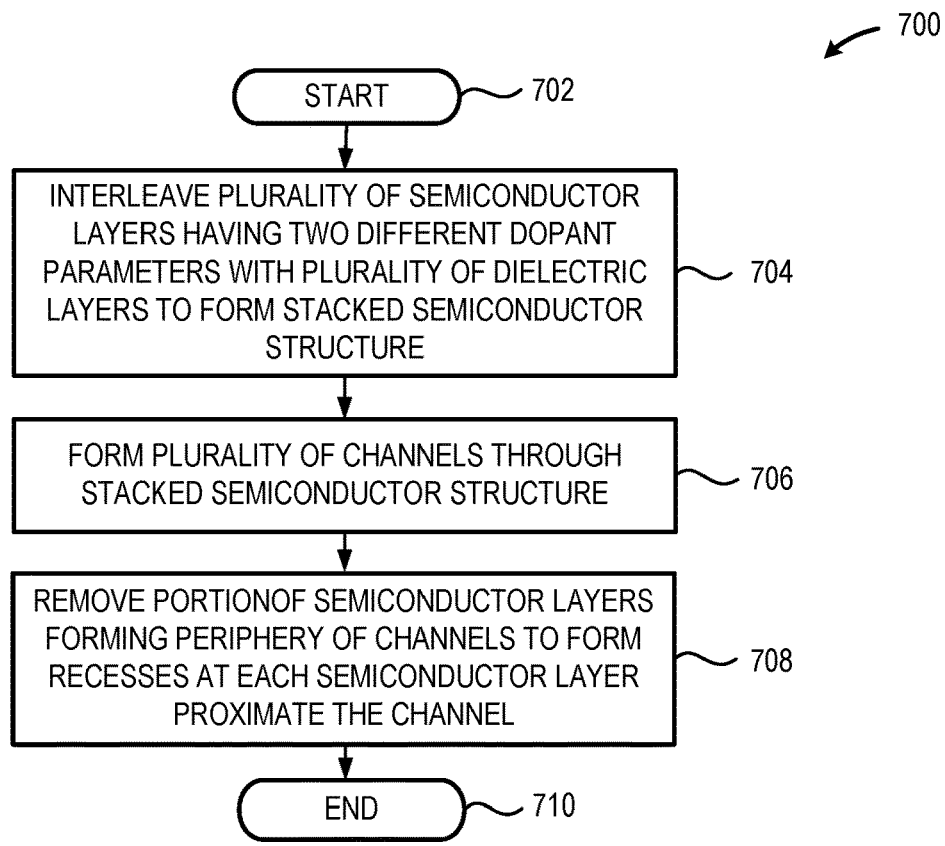
FIG. 7 is a high-level flow diagram of an illustrative method for fabricating a 3D NAND memory structure, in accordance with at least one embodiment described herein.

FIG. 7 is a high-level flow diagram of an illustrative method 700 for fabricating a 3D NAND memory structure 100, in accordance with at least one embodiment described herein. In embodiments, the 3D NAND memory structure 100 includes a stacked semiconductor structure formed using a plurality of semiconductor layers 110 and a plurality of dielectric layers 120 arranged in an alternating fashion such that the semiconductor material layers 110 are interleaved with the dielectric layers 120. Channels are formed in the stacked semiconductor structure and recesses formed in the semiconductor layers along the periphery of the channel provide individual memory cells 140. The method 700 commences at 702.

At 704, a stacked semiconductor providing the basis for the 3D NAND memory structure is formed by depositing alternating layers of semiconductor material and dielectric material. A first portion of the plurality of semiconductor material layers may be doped using a first dopant having at least one first dopant parameter. A second portion of the plurality of semiconductor material layers may be doped using a second dopant having at least one second dopant parameter. The first dopant parameter is different from the second dopant parameter. The different dopant parameters in the semiconductor material layers affects the etch rate of the respective semiconductor material layer.

In embodiments, the first dopant parameter may include a dopant concentration in the first portion of the plurality of semiconductor layers 110. In embodiments, the second dopant parameter may include a dopant concentration in the second portion of the plurality of semiconductor layers 110. In embodiments, the first portion of the plurality of semiconductor layers 110 may be doped using an n-type dopant. In embodiments, the second portion of the plurality of semiconductor layers 110 may also be doped using an n-type dopant. In embodiments, the first portion of the plurality of semiconductor layers 110 may have a dopant concentration of greater than $1\times10^{25}$ atoms of dopant per cubic centimeter. ($cm^{-3}$). In embodiments, the second portion of the plurality of semiconductor layers 110 may have a dopant concentration of less than $1\times10^{25}$ atoms of dopant per cubic centimeter. ($cm^{-3}$). In some implementations, the first dopant may be the same as the second dopant. In some implementations, the first dopant may be different than the second dopant. In some implementations, the first and the second dopants may include one or more phosphorous containing compounds, such as phosphine.

At 706, a plurality of channels 130 are formed in the stacked semiconductor structure. In embodiments, each of the channels 130 includes in the plurality of channels may have the same or a variable diameter. In embodiments, each of the channels 130 may extend continuously or contiguously from an upper surface of the stacked semiconductor structure to a lower surface of the stacked semiconductor structure. The semiconductor material layers and the dielectric layers form the periphery of each of the plurality of channels 130 formed in the stacked semiconductor structure. In embodiments, each of the plurality of channels 130 may have any physical size, shape, and/or configuration. In embodiments, each of the plurality of channels 130 may include a cylindrically-shaped channel 130. In embodiments, each of the plurality of channels 130 may include a conic frustum shaped channel 130.

At 708, a portion of each of the semiconductor material layers 110 is removed about the periphery of each of the channels 130. The removal of the semiconductor material layers 110 creates a plurality of control gate recesses (CGRs) 302 along each channel 130. Each of the CGRs 302 bordered above and below by a dielectric layer 110 that is unaffected by the semiconductor material removal. In embodiments, each of the plurality of CGRs 302 may have the same depth. In embodiments, the depth of each of the plurality of CGRs 302 may define a critical dimension (e.g., a CGR CD). The method 700 concludes at 710.

Figure 8:
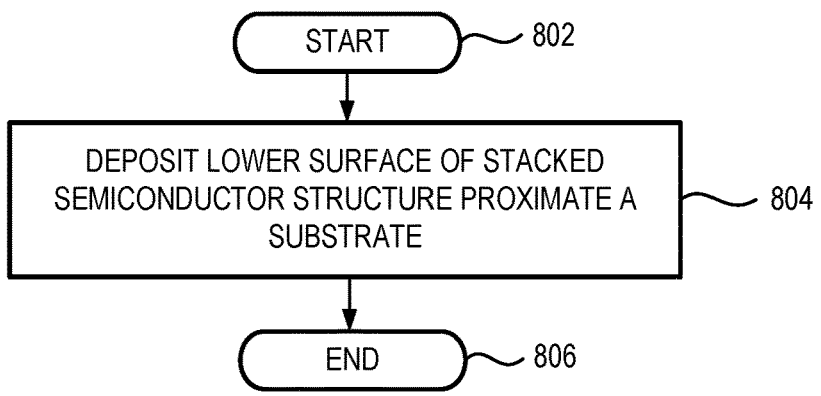
FIG. 8 is a high-level flow diagram of an illustrative method for fabricating a 3D NAND memory structure by stacking the 3D NAND memory structure on a substrate, in accordance with at least one embodiment described herein.

FIG. 8 is a high-level flow diagram of an illustrative method 800 for fabricating a 3D NAND memory structure 100 by stacking the 3D NAND memory structure 100 on a substrate 190, in accordance with at least one embodiment described herein. The method 800 may be used in conjunction with the method 700 described in detail above. The method 800 commences at 802.

At 804, the lower surface of the 3D NAND memory structure 100 may be disposed proximate a substrate. In embodiments, the substrate may include a source layer 150. In embodiments, some or all of the channels 130 may extend to the surface of the source layer 150. In embodiments, some or all of the channels 130 may extend at least partially into the source layer 150. In embodiments, the substrate may include one or more lower or second select gates 186 disposed about the channel 130 between the source layer 150 and the lowermost of the memory cells 140. In some implementations, control circuitry 190 may be disposed proximate the substrate, opposite the 3D NAND memory structure 100. The method 800 concludes at 806.

Figure 9:
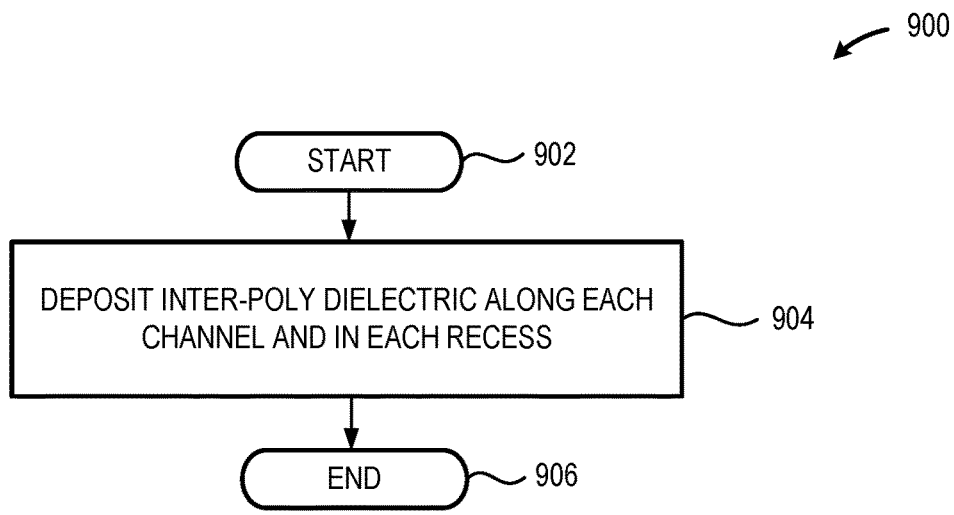
FIG. 9 is a high-level flow diagram of an illustrative method for fabricating a 3D NAND memory structure that includes an inter-poly dielectric (IPD) layer along the channel and the control gate recesses (CGRs), in accordance with at least one embodiment described herein.

FIG. 9 is a high-level flow diagram of an illustrative method 900 for fabricating a 3D NAND memory structure 100 that includes an inter-poly dielectric (IPD) layer 310 along the channel 130 and the control gate recesses 302, in accordance with at least one embodiment described herein. The method 900 may be used in conjunction with the methods 700 and/or 800 described in detail above. The method 900 commences at 902.

At 904, the IPD layer 310 is deposited along the periphery of each of the plurality of channels 130. The IPD layer 310 is also deposited in each of the CGRs 302. The IPD layer 310 may be deposited using any currently available or future developed deposition process or method. The method 900 concludes at 906.

Figure 10:
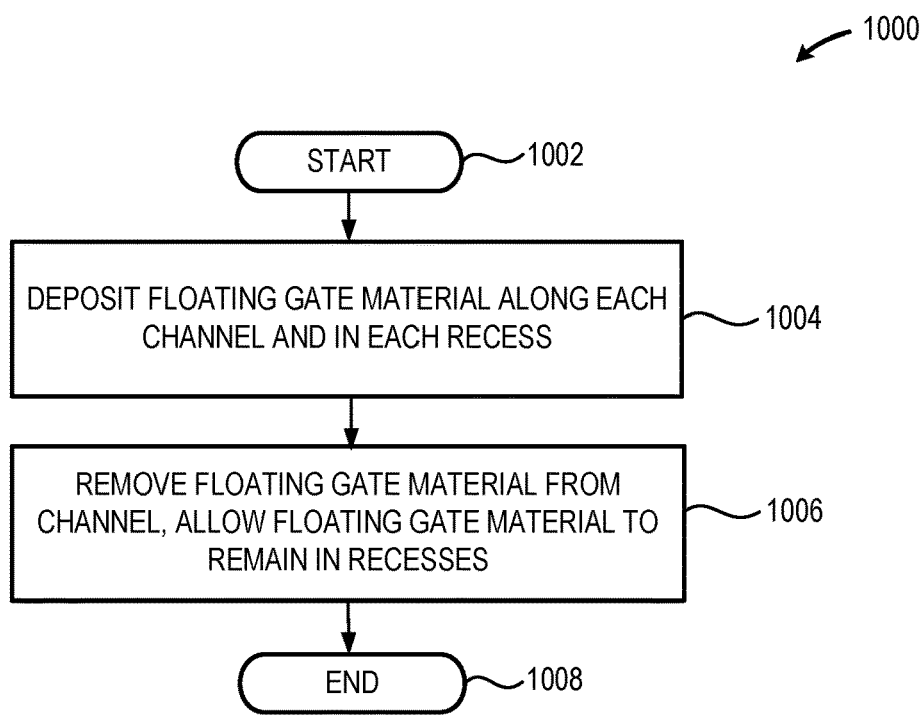
FIG. 10 is a high-level flow diagram of an illustrative method for fabricating a 3D NAND memory structure that includes a floating gate material disposed across the surface of the IPD layer and in the CGRs, in accordance with at least one embodiment described herein.

FIG. 10 is a high-level flow diagram of an illustrative method 1000 for fabricating a 3D NAND memory structure 100 that includes a floating gate material 320 disposed across the surface of the IPD layer 310 and in the CGRs 302, in accordance with at least one embodiment described herein. The method 1000 may be used in conjunction with the methods 700, 800, and/or 900 described in detail above. The method 1000 commences at 1002.

At 1004, a floating gate layer 320 is deposited along the periphery of each of the plurality of channels 130 on top of the IPD layer 310. The floating gate layer 320 is also deposited in each of the CGRs 302. The floating gate layer 320 may be deposited using any currently available or future developed deposition process or method.

At 1006, the portion of the floating gate layer 320 may be removed. In embodiments, the portion of the floating gate layer 320 present in the channel is removed while the portion of the floating gate layer filling the CGRs 302 is permitted to remain. The floating gate layer 320 may be removed using any currently available or future developed material removal process or method. The floating gate layer 320 remaining in each of the CGRs 302 provides the charge accumulation region for each of the memory cells 140 included in the 3D NAND memory structure 100. The method 1000 concludes at 1008.

Figure 11:
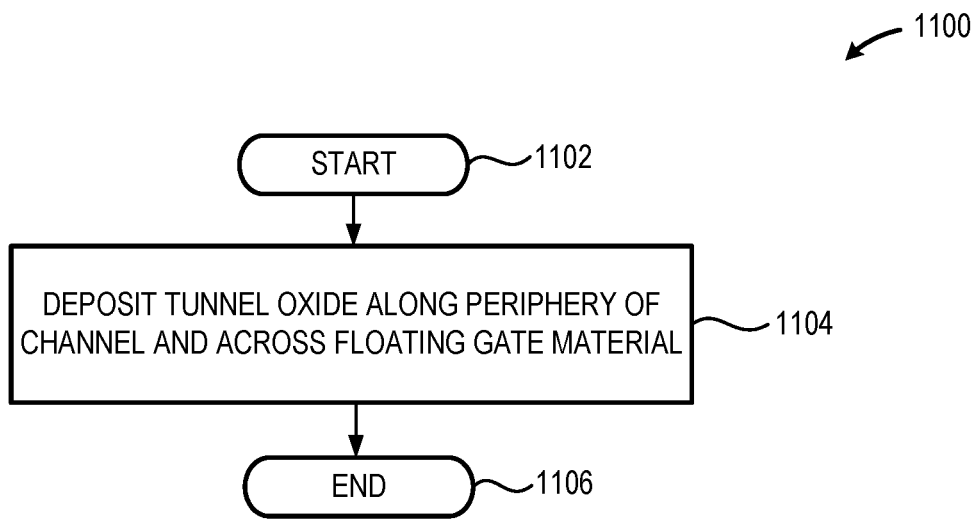
FIG. 11 is a high-level flow diagram of an illustrative method for fabricating a 3D NAND memory structure that includes a tunnel oxide layer deposited across the IPD layer and the floating gate material disposed in the CGRs, in accordance with at least one embodiment described herein.

FIG. 11 is a high-level flow diagram of an illustrative method 1100 for fabricating a 3D NAND memory structure 100 that includes a tunnel oxide layer 330 deposited across the IPD layer 310 and the floating gate material 320 disposed in the CGRs 302, in accordance with at least one embodiment described herein. The method 1100 may be used in conjunction with the methods 700, 800, 900, and/or 1000 described in detail above. The method 1100 commences at 1102.

At 1104, a tunnel oxide layer 330 is deposited across the surface of the IPD layer 310 in each of the plurality of channels 130 and across the exposed surfaces of each of the floating gates 320 in each of the memory sells 140. The tunnel oxide layer 330 may be deposited using any currently available or future developed material deposition process or method. The method 1100 concludes at 1106.

Figure 12:
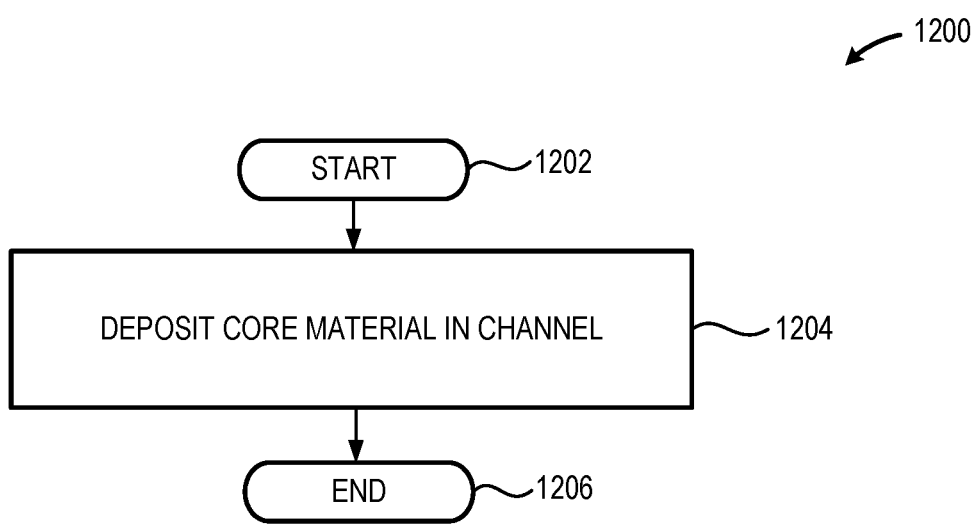
FIG. 12 is a high-level flow diagram of an illustrative method for fabricating a 3D NAND memory structure that includes a core material deposited in the channel, across the tunnel oxide layer 330, in accordance with at least one embodiment described herein.

FIG. 12 is a high-level flow diagram of an illustrative method 1200 for fabricating a 3D NAND memory structure 100 that includes a core material 340 deposited in the channel 130, across the tunnel oxide layer 330, in accordance with at least one embodiment described herein. The method 1200 may be used in conjunction with the methods 700, 800, 900, 1000 and/or 1100 described in detail above. The method 1200 commences at 1202.

At 1204, a core material 340 is deposited across the tunnel oxide layer 330 in each of the plurality of channels 130. The core material 340 may be deposited using any currently available or future developed material deposition process or method. The method 1200 concludes at 1206.

While FIGS. 7 though 12 illustrate various operations according to one or more embodiments, it is to be understood that not all of the operations depicted in FIGS. 7 through 12 are necessary for other embodiments. Indeed, it is fully contemplated herein that in other embodiments of the present disclosure, the operations depicted in FIGS. 7 through 12, and/or other operations described herein, may be combined in a manner not specifically shown in any of the drawings, but still fully consistent with the present disclosure. Thus, claims directed to features and/or operations that are not exactly shown in one drawing are deemed within the scope and content of the present disclosure.

As used in this application and in the claims, a list of items joined by the term "and/or" can mean any combination of the listed items. For example, the phrase "A, B and/or C" can mean A; B; C; A and B; A and C; B and C; or A, B and C. As used in this application and in the claims, a list of items joined by the term "at least one of" can mean any combination of the listed terms. For example, the phrases "at least one of A, B or C" can mean A; B; C; A and B; A and C; B and C; or A, B and C.

Any of the operations described herein may be implemented in a system that includes one or more mediums (e.g., non-transitory storage mediums) having stored therein, individually or in combination, instructions that when executed by one or more processors perform the methods. Here, the processor may include, for example, a server CPU, a mobile device CPU, and/or other programmable circuitry. Also, it is intended that operations described herein may be distributed across a plurality of physical devices, such as processing structures at more than one different physical location. The storage medium may include any type of tangible medium, for example, any type of disk including hard disks, floppy disks, optical disks, compact disk read-only memories (CD-ROMs), rewritable compact disks (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, Solid State Disks (SSDs), embedded multimedia cards (eM-MCs), secure digital input/output (SDIO) cards, magnetic or optical cards, or any type of media suitable for storing electronic instructions. Other embodiments may be implemented as software executed by a programmable control device.

Thus, the present disclosure is directed to 3D NAND data storage systems and methods. In embodiments, a 3D NAND storage device includes a plurality of layers containing doped semiconductor material interleaved with a plurality of layers of dielectric material. A first portion of the plurality of doped semiconductor material layers may be doped with a first dopant having a first dopant parameter. A second portion of the plurality of doped semiconductor material layers may be doped with a second dopant having a second dopant parameter. In embodiments, the first portion of the plurality of doped semiconductor layers may include a dopant at a concentration less than a defined threshold. In embodiments, the second portion of the plurality of doped semiconductor layers may include a dopant at a concentration less than the defined threshold. The differing dopant concentrations have been found to beneficially and advantageously affect the etch rate in the respective semiconductor layers when forming control gate recesses in the semiconductor layers.

The following examples pertain to further embodiments. The following examples of the present disclosure may comprise subject material such as at least one device, a method, at least one machine-readable medium for storing instructions that when executed cause a machine to perform acts based on the method, means for performing acts based on the method and/or a system for fabricating a three-dimensional NAND storage device.

According to example 1, there is provided a semiconductor device. The device may include a stacked semiconductor structure having an upper surface and a transversely opposed lower surface, the stacked semiconductor structure including: a plurality of layers formed using a dielectric material; and a plurality of layers formed using a semiconductor material. Each of the plurality of layers of semiconductor material may be interleaved between layers of dielectric material. Each of at least some of the plurality of layers of semiconductor material may include a first dopant having one or more first dopant parameters. Each of at least some of the plurality of layers of semiconductor material include a second dopant having one or more second dopant parameters, the one or more second dopant parameters different than the one or more first dopant parameters; a plurality of channels, each of the channels penetrating the stacked semiconductor structure from the upper surface to the lower surface; and a recess formed in each of layers of semiconductor material in each of the plurality of channels.

Example 2 may include elements of example 1, and the device may additionally include: a substrate disposed proximate the lower surface of the stacked semiconductor structure; where the substrate includes at least one source layer formed using one or more semiconductor materials.

Example 3 may include elements of example 2 and the device may further include: an inter-poly dielectric (IPD) layer disposed across at least a portion of each of the plurality of channels and in the recess about the periphery of each of the plurality of channels at each of the plurality of layers of semiconductor material.

Example 4 may include elements of example 3 where the IPD layer comprises at least one of: silicon oxide, silicon nitride, or silicon oxynitride.

Example 5 may include elements of example 3, and the device may additionally include: a floating gate material disposed in at least some of the recesses about the periphery of each of the plurality of channels at each of the plurality of layers of semiconductor material.

Example 6 may include elements of example 5 where the floating gate material may include at least one of: p-doped silicon; n-doped silicon; or undoped silicon.

Example 7 may include elements of example 6, and the device may additionally include: a tunnel oxide layer disposed across at least a portion of each of the plurality of channels and across at least a portion of the floating gate material disposed in at least some of the recesses about the periphery of each of the plurality of channels at each of the plurality of layers of semiconductor material.

Example 8 may include elements of example 7, and the device may additionally include: a core material disposed in each of at least some of the plurality of channels.

Example 9 may include elements of any of examples 1 through 8 where the one or more first dopant parameters comprise a first dopant concentration; and where the one or more second dopant parameters comprise a second dopant concentration where the second dopant concentration is different from the first dopant concentration.

Example 10 may include elements of example 9 where the first dopant comprises an n-type dopant; and where the first dopant concentration comprises a phosphine concentration of greater than $1\times10^{25}$ atoms per cubic centimeter ($cm^{-3}$).

Example 11 may include elements of example 10 where the first dopant may include one of: phosphorus; phosphorus containing compounds (e.g., phosphine); arsenic; arsenic containing compounds; bismuth; bismuth containing compounds; antimony; antimony containing compounds; lithium; or lithium containing compounds.

Example 12 may include elements of example 10 where the second dopant comprises an n-type dopant; and where the second dopant concentration may include a phosphine concentration of less than $1\times10^{25}$ atoms per cubic centimeter ($cm^{-3}$).

Example 13 may include elements of example 12 where the second dopant may include one of: phosphorus; phosphorus containing compounds (e.g., phosphine); arsenic; arsenic containing compounds; bismuth; bismuth containing compounds; antimony; antimony containing compounds; lithium; or lithium containing compounds.

Example 14 may include elements of example 9 where each of the plurality of layers of semiconductor material includes a layer having a thickness of less than 100 nanometers (nm).

Example 15 may include elements of example 9 where each of the plurality of layers of dielectric material includes a layer having a thickness of less than 100 nanometers (nm).

According to example 16, there is provided a 3D NAND fabrication method. The method may include: interleaving each of a plurality of layers formed using a semiconductor material with a plurality of layers formed using a dielectric material to provide a stacked semiconductor structure having an upper surface and a lower surface; where a first portion of the plurality of layers of semiconductor material include a first dopant having one or more first dopant parameters; and where a second portion of the plurality of layers of semiconductor material include a second dopant having one or more second dopant parameters, the one or more second dopant parameters different than the one or more first dopant parameters; forming a plurality of channels through the stacked semiconductor structure, each of the plurality of channels extending from the upper surface to the lower surface of the stacked semiconductor structure; and removing a portion of at least some of the plurality of layers of semiconductor material forming a periphery of at least a portion of the plurality of channels to provide a recess about the periphery of each of the plurality of channels at each of the plurality of layers of semiconductor material.

Example 17 may include elements of example 16 and the method may additionally include: depositing the lower surface of the stacked semiconductor structure proximate a substrate, wherein the substrate includes at least one source layer formed using one or more semiconductor materials.

Example 18 may include elements of example 17 and the method may additionally include: depositing an inter-poly dielectric (IPD) layer across at least a portion of each of the plurality of channels and in each of the recessed formed in the periphery of each of the plurality of channels at each of the plurality of layers of semiconductor material.

Example 19 may include elements of example 18 where depositing an inter-poly dielectric (IPD) may include: depositing an IPD layer comprising at least one of: silicon oxide, silicon nitride, or silicon oxynitride across at least a portion of each of the plurality of channels and in each of the recessed formed in the periphery of each of the plurality of channels at each of the plurality of layers of semiconductor material.

Example 20 may include elements of example 18 and the method may additionally include: depositing a floating gate material in at least some of the recesses about the periphery of each of the plurality of channels at each of the plurality of layers of semiconductor material.

Example 21 may include elements of example 20 where depositing a floating gate material may include: depositing a floating gate material comprising at least one of: p-doped silicon; n-doped silicon; or undoped silicon in at least some of the recesses about the periphery of each of the plurality of channels at each of the plurality of layers of semiconductor material.

Example 22 may include elements of example 20 and the method may additionally include: depositing a tunnel oxide layer across at least a portion of each of the plurality of channels and across at least a portion of the floating gate material disposed in at least some of the recesses about the periphery of each of the plurality of channels at each of the plurality of layers of semiconductor material.

Example 23 may include elements of example 22 and the method may additionally include: disposing a core material in each of at least some of the plurality of channels.

Example 24 may include elements of any of examples 16 through 23 where interleaving each of a plurality of layers formed using a semiconductor material with a plurality of layers formed using a dielectric material may further include: interleaving each of a plurality of layers formed using a semiconductor material wherein at least some of the plurality of layers of semiconductor material include a first dopant having a first dopant concentration; and interleaving each of a plurality of layers formed using a semiconductor material wherein at least some of the plurality of layers of semiconductor material include a second dopant concentration that is different from the first dopant concentration.

Example 25 may include elements of example 24 where interleaving each of a plurality of layers formed using a semiconductor material wherein at least some of the plurality of layers of semiconductor material include a first dopant having a first dopant concentration may include: interleaving each of a plurality of layers formed using the semiconductor material wherein at least some of the plurality of layers include a semiconductor material that includes a first dopant that includes an n-type dopant at a first dopant concentration of greater than $1\times10^{25}$ atoms per cubic centimeter ($cm^{-3}$).

Example 26 may include elements of example 25 where interleaving each of a plurality of layers formed using the semiconductor material wherein at least some of the plurality of layers include a semiconductor material having a first dopant that includes an n-type dopant at a first dopant concentration of greater than $1\times10^{25}$ atoms per cubic centimeter ($cm^{-3}$) may further include: interleaving each of a plurality of layers formed using the semiconductor material wherein at least some of the plurality of layers include a semiconductor material having first dopant that includes one of: phosphorus; a phosphorus containing compound (e.g., phosphine); arsenic; an arsenic containing compound; bismuth; a bismuth containing compound; antimony; an antimony containing compound; lithium; or a lithium containing compound.

Example 27 may include elements of example 25 where interleaving each of a plurality of layers formed using a semiconductor material wherein at least some of the plurality of layers of semiconductor material include a second dopant having a second dopant concentration may further include: interleaving each of a plurality of layers formed using the semiconductor material wherein at least some of the plurality of layers include a semiconductor material having a second dopant that includes an n-type dopant at a second dopant concentration of less than $1\times10^{25}$ atoms per cubic centimeter ($cm^{-3}$).

Example 28 may include elements of example 27 where interleaving each of a plurality of layers formed using the semiconductor material wherein at least some of the plurality of layers include a semiconductor material having a second dopant that includes an n-type dopant at a second dopant concentration of less than $1\times10^{25}$ atoms per cubic centimeter ($cm^{-3}$) may further include: interleaving each of a plurality of layers formed using the semiconductor material wherein at least some of the plurality of layers include a semiconductor material having a second dopant that includes one of: phosphorus; a phosphorus containing compound (e.g., phosphine); arsenic; an arsenic containing compound; bismuth; a bismuth containing compound; antimony; an antimony containing compound; lithium; or a lithium containing compound.

Example 29 may include elements of example 16 where interleaving each of a plurality of layers formed using a semiconductor material with a plurality of layers formed using a dielectric material to provide a stacked semiconductor structure having an upper surface and a lower surface may further include: interleaving each of a plurality of layers formed using a semiconductor material, each of the plurality of layers of semiconductor material having a thickness of less than 100 nanometers (nm).

Example 30 may include elements of example 16 where interleaving each of a plurality of layers formed using a semiconductor material with a plurality of layers formed using a dielectric material to provide a stacked semiconductor structure having an upper surface and a lower surface may further include: interleaving each of a plurality of layers formed using a dielectric material, each of the plurality of layers of dielectric material having a thickness of less than 100 nanometers (nm).

According to example 31, there is provided a stacked semiconductor fabrication system. The system may include: a means for interleaving each of a plurality of layers formed using a semiconductor material with a plurality of layers formed using a dielectric material to provide a stacked semiconductor structure having an upper surface and a lower surface; where at least some of the plurality of layers of semiconductor material include a first dopant having one or more first dopant parameters; and where at least some of the plurality of layers of semiconductor material include a second dopant having one or more second dopant parameters, the one or more second dopant parameters different than the one or more first dopant parameters; a means for forming a plurality of channels through the stacked semiconductor structure, each of the plurality of channels extending from the upper surface to the lower surface of the stacked semiconductor structure; and means for removing a portion of at least some of the plurality of layers of semiconductor material forming a periphery of at least a portion of the plurality of channels to provide a recess about the periphery of each of the plurality of channels at each of the plurality of layers of semiconductor material.

Example 32 may include elements of example 31, and the system may further include: means for depositing the lower surface of the stacked semiconductor structure proximate a substrate, wherein the substrate includes at least one source layer formed using one or more semiconductor materials.

Example 33 may include elements of example 32, and the system may further include: means for depositing an inter-poly dielectric (IPD) layer across at least a portion of each of the plurality of channels and in each of the recessed formed in the periphery of each of the plurality of channels at each of the plurality of layers of semiconductor material.

Example 34 may include elements of example 33 where the means for depositing an inter-poly dielectric (IPD) may include: means for depositing an IPD layer comprising at least one of: silicon oxide, silicon nitride, or silicon oxynitride across at least a portion of each of the plurality of channels and in each of the recessed formed in the periphery of each of the plurality of channels at each of the plurality of layers of semiconductor material.

Example 35 may include elements of example 33, and the system may further include: means for depositing a floating gate material in at least some of the recesses about the periphery of each of the plurality of channels at each of the plurality of layers of semiconductor material.

Example 36 may include elements of example 35 where the means for depositing a floating gate material may include: means for depositing a floating gate material comprising at least one of: p-doped silicon; n-doped silicon; or undoped silicon in at least some of the recesses about the periphery of each of the plurality of channels at each of the plurality of layers of semiconductor material.

Example 37 may include elements of example 35, and the system may further include: means for depositing a tunnel oxide layer across at least a portion of each of the plurality of channels and across at least a portion of the floating gate material disposed in at least some of the recesses about the periphery of each of the plurality of channels at each of the plurality of layers of semiconductor material.

Example 38 may include elements of example 37, and the system may further include: means for disposing a core material in each of at least some of the plurality of channels.

Example 39 may include elements of any of examples 31 through 38 where the means for interleaving each of a plurality of layers formed using a semiconductor material with a plurality of layers formed using a dielectric material may further include: means for interleaving each of a plurality of layers formed using a semiconductor material wherein at least some of the plurality of layers of semiconductor material include a first dopant having a first dopant concentration; and means for interleaving each of a plurality of layers formed using a semiconductor material wherein at least some of the plurality of layers of semiconductor material include a second dopant concentration that is different from the first dopant concentration.

Example 40 may include elements of example 39 where the means for interleaving each of a plurality of layers formed using a semiconductor material wherein at least some of the plurality of layers of semiconductor material include a first dopant having a first dopant concentration may further include: means for interleaving each of a plurality of layers formed using the semiconductor material wherein at least some of the plurality of layers include a semiconductor material that includes a first dopant that includes an n-type dopant at a first dopant concentration of greater than $1\times10^{25}$ atoms per cubic centimeter ($cm^{-3}$).

Example 41 may include elements of example 39 where the means for interleaving each of a plurality of layers formed using the semiconductor material wherein at least some of the plurality of layers include a semiconductor material having a first dopant that includes an n-type dopant at a first dopant concentration of greater than $1\times10^{25}$ atoms per cubic centimeter ($cm^{-3}$) may further include: means for interleaving each of a plurality of layers formed using the semiconductor material wherein at least some of the plurality of layers include a semiconductor material having first dopant that includes one of: phosphorus; a phosphorus containing compound (e.g., phosphine); arsenic; an arsenic containing compound; bismuth; a bismuth containing compound; antimony; an antimony containing compound; lithium; or a lithium containing compound.

Example 42 may include elements of example 40 where the means for interleaving each of a plurality of layers formed using a semiconductor material wherein at least some of the plurality of layers of semiconductor material include a second dopant having a second dopant concentration may further include: means for interleaving each of a plurality of layers formed using the semiconductor material wherein at least some of the plurality of layers include a semiconductor material having a second dopant that includes an n-type dopant at a second dopant concentration of less than $1\times10^{25}$ atoms per cubic centimeter ($cm^{-3}$).

Example 43 may include elements of example 42 where interleaving each of a plurality of layers formed using the semiconductor material wherein at least some of the plurality of layers include a semiconductor material having a second dopant that includes an n-type dopant at a second dopant concentration of less than $1\times10^{25}$ atoms per cubic centimeter ($cm^{-3}$) may further include: interleaving each of a plurality of layers formed using the semiconductor material wherein at least some of the plurality of layers include a semiconductor material having a second dopant that includes one of: phosphorus; a phosphorus containing compound (e.g., phosphine); arsenic; an arsenic containing compound; bismuth; a bismuth containing compound; antimony; an antimony containing compound; lithium; or a lithium containing compound.

Example 44 may include elements of example 31 where the means for interleaving each of a plurality of layers formed using a semiconductor material with a plurality of layers formed using a dielectric material to provide a stacked semiconductor structure having an upper surface and a lower surface may further include: means for interleaving each of a plurality of layers formed using a semiconductor material, each of the plurality of layers of semiconductor material having a thickness of less than 100 nanometers (nm).

Example 45 may include elements of example 31 where the means for interleaving each of a plurality of layers formed using a semiconductor material with a plurality of layers formed using a dielectric material to provide a stacked semiconductor structure having an upper surface and a lower surface may further include: means for interleaving each of a plurality of layers formed using a dielectric material, each of the plurality of layers of dielectric material having a thickness of less than 100 nanometers (nm).

According to example 46, there is provided an electronic device. The electronic device may include: processor circuitry; and a stacked semiconductor structure communicably coupled to the processor circuitry, the stacked semiconductor structure including an upper surface and a transversely opposed lower surface, the stacked semiconductor structure including: a plurality of layers formed using a dielectric material; and a plurality of layers formed using a semiconductor material; wherein each of the plurality of layers of semiconductor material are interleaved between layers of dielectric material; wherein at least some of the plurality of layers of semiconductor material include a first dopant having one or more first dopant parameters; and wherein at least some of the plurality of layers of semiconductor material include a second dopant having one or more second dopant parameters, the one or more second dopant parameters different than the one or more first dopant parameters; a plurality of channels, each of the channels penetrating the stacked semiconductor structure from the upper surface to the lower surface; and a recess about the periphery of each of the plurality of channels at each of the plurality of layers of semiconductor material in each of the plurality of channels.

Example 47 may include elements of example 46 where the stacked semiconductor device further may include: a substrate disposed proximate the lower surface of the stacked semiconductor structure; where the substrate includes at least one source layer formed using one or more semiconductor materials.

Example 48 may include elements of example 47 where the stacked semiconductor device may further include: an inter-poly dielectric (IPD) layer disposed across at least a portion of each of the plurality of channels and in the recess about the periphery of each of the plurality of channels at each of the plurality of layers of semiconductor material.

Example 49 may include elements of example 48 where the stacked semiconductor device includes an IPD layer that includes at least one of: silicon oxide, silicon nitride, or silicon oxynitride.

Example 50 may include elements of example 48 where the stacked semiconductor device may further include: a floating gate material disposed in at least some of the recesses about the periphery of each of the plurality of channels at each of the plurality of layers of semiconductor material.

Example 51 may include elements of example 50 where the stacked semiconductor device floating gate material may include at least one of: p-doped silicon; n-doped silicon; or undoped silicon.

Example 52 may include elements of example 51 where stacked semiconductor device may further include: a tunnel oxide layer disposed across at least a portion of each of the plurality of channels and across at least a portion of the floating gate material disposed in at least some of the recesses about the periphery of each of the plurality of channels at each of the plurality of layers of semiconductor material.

Example 53 may include elements of example 52 where the stacked semiconductor device may further include: a core material disposed in each of at least some of the plurality of channels.

Example 54 may include elements of any of examples 46 through 53 where the one or more first dopant parameters may include a first dopant concentration; and where the one or more second dopant parameters comprise a second dopant concentration where the second dopant concentration is different from the first dopant concentration.

Example 55 may include elements of example 54 where the first dopant may include an n-type dopant; and where the first dopant concentration may include a phosphine concentration of greater than $1\times10^{25}$ atoms per cubic centimeter ($cm^{-3}$).

Example 56 may include elements of example 55 where the first dopant may include one of: phosphorus; phosphorus containing compounds (e.g., phosphine); arsenic; arsenic containing compounds; bismuth; bismuth containing compounds; antimony; antimony containing compounds; lithium; or lithium containing compounds.

Example 57 may include elements of example 55 where the second dopant may include an n-type dopant and where the second dopant concentration comprises a phosphine concentration of less than $1 \times 10^{25}$ atoms per cubic centimeter (cm$^{-3}$).

Example 58 may include elements of example 57 where the second dopant may include one of: phosphorus; phosphorus containing compounds (e.g., phosphine); arsenic; arsenic containing compounds; bismuth; bismuth containing compounds; antimony; antimony containing compounds; lithium; or lithium containing compounds.

Example 59 may include elements of example 46 where each of the plurality of layers of semiconductor material have a thickness of less than 100 nanometers (nm).

Example 60 may include elements of example 59 where each of the plurality of layers of dielectric material have a thickness of less than 100 nanometers (nm).

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

What is claimed:

1. A semiconductor device, comprising:
   a stacked semiconductor structure having an upper surface and a transversely opposed lower surface, the stacked semiconductor structure including:
      a plurality of layers formed using a dielectric material; and
      a plurality of layers formed using a semiconductor material;
         wherein each of the plurality of layers of semiconductor material are interleaved between layers of dielectric material;
         wherein at least some of the plurality of layers of semiconductor material include a first dopant having one or more first dopant parameters; and
         wherein at least some of the plurality of layers of semiconductor material include a second dopant having one or more second dopant parameters, the one or more second dopant parameters different than the one or more first dopant parameters;
   a plurality of channels, each of the channels penetrating the stacked semiconductor structure from the upper surface to the lower surface; and
   a recess about the periphery of each of the plurality of channels at each of the plurality of layers of semiconductor material in each of the plurality of channels.

2. The semiconductor device of claim 1, further comprising:
   a substrate disposed proximate the lower surface of the stacked semiconductor structure;
      wherein the substrate includes at least one source layer formed using one or more semiconductor materials.

3. The semiconductor device of claim 2, further comprising:
   an inter-poly dielectric (IPD) layer disposed across at least a portion of each of the plurality of channels and in the recess about the periphery of each of the plurality of channels at each of the plurality of layers of semiconductor material;
      wherein the IPD layer comprises at least one of: silicon oxide, silicon nitride, or silicon oxynitride.

4. The semiconductor device of claim 3, further comprising:
   a floating gate material disposed in at least some of the recesses about the periphery of each of the plurality of channels at each of the plurality of layers of semiconductor material,
      wherein the floating gate material comprises at least one of: p-doped silicon; n-doped silicon; or undoped silicon.

5. The semiconductor device of claim 4, further comprising:
   a tunnel oxide layer disposed across at least a portion of each of the plurality of channels and across at least a portion of the floating gate material disposed in at least some of the recesses about the periphery of each of the plurality of channels at each of the plurality of layers of semiconductor material.

6. The semiconductor device of claim 5, further comprising:
   a core material disposed in each of at least some of the plurality of channels.

7. The semiconductor device of any of claim 1:
   wherein the one or more first dopant parameters comprise a first dopant concentration;
   wherein the one or more second dopant parameters comprise a second dopant concentration where the second dopant concentration is different from the first dopant concentration.

8. The semiconductor device of claim 7:
   wherein the first dopant comprises an n-type dopant;
   wherein the first dopant concentration comprises a phosphine concentration of greater than $1 \times 10^{25}$ atoms per cubic centimeter (cm$^{-3}$);
   wherein the second dopant comprises an n-type dopant; and
   wherein the second dopant concentration comprises a phosphine concentration of less than $1 \times 10^{25}$ atoms per cubic centimeter (cm$^{-3}$).

9. The semiconductor device of claim 8 wherein the first dopant comprises one of: phosphorus; phosphorus containing compounds; arsenic; arsenic containing compounds; bismuth; bismuth containing compounds; antimony; antimony containing compounds; lithium; or lithium containing compounds.

10. The semiconductor device of claim 9 wherein the second dopant comprises one of: phosphorus; phosphorus containing compounds (e.g., phosphine); arsenic; arsenic containing compounds; bismuth; bismuth containing compounds; antimony; antimony containing compounds; lithium; or lithium containing compounds.

11. A stacked semiconductor fabrication method, comprising:
   interleaving each of a plurality of layers formed using a semiconductor material with a plurality of layers formed using a dielectric material to provide a stacked semiconductor structure having an upper surface and a lower surface;
      wherein a first portion of the plurality of layers of semiconductor material include a first dopant having one or more first dopant parameters; and
      wherein a second portion of the plurality of layers of semiconductor material include a second dopant having one or more second dopant parameters, the one or more second dopant parameters different than the one or more first dopant parameters;
   forming a plurality of channels through the stacked semiconductor structure, each of the plurality of channels extending from the upper surface to the lower surface of the stacked semiconductor structure; and removing a portion of at least some of the plurality of layers of semiconductor material forming a periphery of at least a portion of the plurality of channels to provide a recess about the periphery of each of the plurality of channels at each of the plurality of layers of semiconductor material.

12. The stacked semiconductor fabrication method of claim 11, further comprising:
depositing the lower surface of the stacked semiconductor structure proximate a substrate, wherein the substrate includes at least one source layer formed using one or more semiconductor materials.

13. The stacked semiconductor fabrication method of claim 12, further comprising:
depositing an inter-poly dielectric (IPD) layer across at least a portion of each of the plurality of channels and in each of the recessed formed in the periphery of each of the plurality of channels at each of the plurality of layers of semiconductor material;
wherein the IPD layer comprises at least one of: silicon oxide, silicon nitride, or silicon oxynitride across at least a portion of each of the plurality of channels and in each of the recessed formed in the periphery of each of the plurality of channels at each of the plurality of layers of semiconductor material.

14. The stacked semiconductor fabrication method of claim 13, further comprising:
depositing a floating gate material in at least some of the recesses about the periphery of each of the plurality of channels at each of the plurality of layers of semiconductor material;
wherein the floating gate material comprises at least one of: p-doped silicon; n-doped silicon; or undoped silicon in at least some of the recesses about the periphery of each of the plurality of channels at each of the plurality of layers of semiconductor material.

15. The stacked semiconductor fabrication method of claim 14, further comprising:
depositing a tunnel oxide layer across at least a portion of each of the plurality of channels and across at least a portion of the floating gate material disposed in at least some of the recesses about the periphery of each of the plurality of channels at each of the plurality of layers of semiconductor material.

16. The stacked semiconductor fabrication method of claim 15, further comprising:
disposing a core material in each of at least some of the plurality of channels.

17. The stacked semiconductor fabrication method of claim 16 wherein interleaving each of a plurality of layers formed using a semiconductor material with a plurality of layers formed using a dielectric material to provide a stacked semiconductor structure having an upper surface and a lower surface further comprises:
interleaving each of a plurality of layers formed using a semiconductor material, each of the plurality of layers of semiconductor material having a thickness of less than 100 nanometers (nm) with each of a plurality of layers formed using a dielectric material, each of the plurality of layers of dielectric material having a thickness of less than 100 nanometers (nm).

18. The stacked semiconductor fabrication method of claim 11 wherein interleaving each of a plurality of layers formed using a semiconductor material with a plurality of layers formed using a dielectric material further comprises:
interleaving each of a plurality of layers formed using a semiconductor material wherein at least some of the plurality of layers of semiconductor material include a first dopant having a first dopant concentration; and
interleaving each of a plurality of layers formed using a semiconductor material wherein at least some of the plurality of layers of semiconductor material include a second dopant concentration that is different from the first dopant concentration.

19. The stacked semiconductor fabrication method of claim 18 wherein interleaving each of a plurality of layers formed using a semiconductor material wherein at least some of the plurality of layers of semiconductor material include a first dopant having a first dopant concentration further comprises:
interleaving each of a plurality of layers formed using the semiconductor material wherein at least some of the plurality of layers include a semiconductor material that includes a first dopant that includes an n-type dopant at a first dopant concentration of greater than $1\times10^{25}$ atoms per cubic centimeter ($cm^{-3}$);
wherein the first dopant includes one of: phosphorus; a phosphorus containing compound (e.g., phosphine); arsenic; an arsenic containing compound; bismuth; a bismuth containing compound; antimony; an antimony containing compound; lithium; or a lithium containing compound.

20. The stacked semiconductor fabrication method of claim 19 wherein interleaving each of a plurality of layers formed using a semiconductor material wherein at least some of the plurality of layers of semiconductor material include a second dopant having a second dopant concentration further comprises:
interleaving each of a plurality of layers formed using the semiconductor material wherein at least some of the plurality of layers include a semiconductor material having a second dopant that includes an n-type dopant at a second dopant concentration of less than $1\times10^{25}$ atoms per cubic centimeter ($cm^{-3}$);
wherein the second dopant includes one of: phosphorus; a phosphorus containing compound; arsenic; an arsenic containing compound; bismuth; a bismuth containing compound; antimony; an antimony containing compound; lithium; or a lithium containing compound.

21. An electronic device, comprising:
a stacked semiconductor structure having an upper surface and a transversely opposed lower surface, the stacked semiconductor structure including:
a plurality of layers formed using a dielectric material; and
a plurality of layers formed using a semiconductor material;
wherein each of the plurality of layers of semiconductor material are interleaved between layers of dielectric material;
wherein at least some of the plurality of layers of semiconductor material include a first dopant having one or more first dopant parameters; and
wherein at least some of the plurality of layers of semiconductor material include a second dopant having one or more second dopant parameters, the one or more second dopant parameters different than the one or more first dopant parameters;
a plurality of channels, each of the channels penetrating the stacked semiconductor structure from the upper surface to the lower surface; and
a recess about the periphery of each of the plurality of channels at each of the plurality of layers of semiconductor material in each of the plurality of channels.

22. The electronic device of claim 21 wherein the stacked semiconductor structure further comprises:
- a substrate disposed proximate the lower surface of the stacked semiconductor structure;
    - wherein the substrate includes at least one source layer formed using one or more semiconductor materials.

23. The electronic device of claim 22 wherein the stacked semiconductor structure further comprises:
- an inter-poly dielectric (IPD) layer disposed across at least a portion of each of the plurality of channels and in the recess about the periphery of each of the plurality of channels at each of the plurality of layers of semiconductor material;
    - wherein the IPD layer comprises at least one of: silicon oxide, silicon nitride, or silicon oxynitride.

24. The electronic device of claim 23 wherein the stacked semiconductor structure further comprises:
- a floating gate material disposed in at least some of the recesses about the periphery of each of the plurality of channels at each of the plurality of layers of semiconductor material,
    - wherein the floating gate material comprises at least one of: p-doped silicon; n-doped silicon; or undoped silicon.

25. The electronic device of claim 24 wherein the stacked semiconductor structure further comprises:
- a tunnel oxide layer disposed across at least a portion of each of the plurality of channels and across at least a portion of the floating gate material disposed in at least some of the recesses about the periphery of each of the plurality of channels at each of the plurality of layers of semiconductor material.

\* \* \* \* \*